United States Patent
Lee et al.

(10) Patent No.: US 12,048,215 B2
(45) Date of Patent: Jul. 23, 2024

(54) DISPLAY APPARATUS

(71) Applicant: LG Display Co., Ltd., Seoul (KR)

(72) Inventors: Chung Hoon Lee, Paju-si (KR);
SeungHo Heo, Paju-si (KR);
SungWook Yoon, Goyang-si (KR);
Donghyun Lee, Incheon (KR)

(73) Assignee: LG Display Co., Ltd., Seoul (KR)

( * ) Notice: Subject to any disclaimer, the term of this patent is extended or adjusted under 35 U.S.C. 154(b) by 448 days.

(21) Appl. No.: 17/316,436

(22) Filed: May 10, 2021

(65) Prior Publication Data

US 2021/0351248 A1   Nov. 11, 2021

(30) Foreign Application Priority Data

May 11, 2020  (KR) .................. 10-2020-0056145

(51) Int. Cl.
*H10K 59/131*    (2023.01)
*H10K 59/122*    (2023.01)
*H10K 59/35*     (2023.01)

(52) U.S. Cl.
CPC ......... *H10K 59/353* (2023.02); *H10K 59/122* (2023.02); *H10K 59/131* (2023.02)

(58) Field of Classification Search
CPC .................... H10K 59/131; H10K 59/353
See application file for complete search history.

(56) References Cited

U.S. PATENT DOCUMENTS

| | | | |
|---|---|---|---|
| 9,748,317 | B2 | 8/2017 | Kim et al. |
| 10,340,318 | B2 | 7/2019 | Kim et al. |
| 10,672,339 | B2 | 6/2020 | Kim et al. |
| 2004/0160170 | A1 | 8/2004 | Sato et al. |

(Continued)

FOREIGN PATENT DOCUMENTS

| | | |
|---|---|---|
| CN | 108110029 A | 6/2018 |
| CN | 108231830 A | 6/2018 |

(Continued)

OTHER PUBLICATIONS

European Patent Office, Extended European Search Report and Opinion, EP Patent Application No. 21173243.3, Oct. 7, 2021, ten pages.

(Continued)

*Primary Examiner* — Douglas M Menz
(74) *Attorney, Agent, or Firm* — Fenwick & West LLP

(57) ABSTRACT

Provided is a display apparatus that includes a substrate in which a plurality of sub pixels are defined; a plurality of light emitting diodes which are disposed in the plurality of sub pixels, the plurality of light emitting diodes having an organic layer shared between the plurality of light emitting diodes and a cathode electrode shared between the plurality of light emitting diodes; a bank disposed below the cathode electrode and between pairs of light emitting diodes from the plurality of light emitting diodes; a plurality of wiring lines disposed between the bank and the substrate; and a first pattern through a thickness of the bank, the first pattern overlapping a first wiring line from the plurality of wiring lines, wherein a first portion of the cathode electrode is disposed outside of the first pattern and a second portion of the cathode electrode is disposed in the first pattern.

24 Claims, 16 Drawing Sheets

(56) References Cited

U.S. PATENT DOCUMENTS

| | | | |
|---|---|---|---|
| 2008/0036705 A1* | 2/2008 | Iwashita | ................ H10K 59/12 345/76 |
| 2014/0239262 A1 | 8/2014 | Kim et al. | |
| 2014/0346484 A1 | 11/2014 | Nendai et al. | |
| 2016/0079322 A1 | 3/2016 | Kim et al. | |
| 2018/0151646 A1 | 5/2018 | Kim et al. | |
| 2018/0166015 A1 | 6/2018 | Kim et al. | |
| 2021/0013296 A1 | 1/2021 | Ochi et al. | |

FOREIGN PATENT DOCUMENTS

| | | |
|---|---|---|
| TW | 201613088 A | 4/2016 |
| WO | WO 2019/186979 A1 | 10/2019 |

OTHER PUBLICATIONS

Office Action, Taiwan Intellectual Property Office Patent Application No. 110116624, Mar. 3, 2022, 11 pages.

\* cited by examiner

DISPLAY APPARATUS

CROSS-REFERENCE TO RELATED APPLICATIONS

This application claims the priority of Republic of Korea Patent Application No. 10-2020-0056145 filed on May 11, 2020, in the Korean Intellectual Property Office, which is incorporated by reference in its entirety.

BACKGROUND

Field

The present disclosure relates to a display apparatus, and more particularly, to a display apparatus which may improve color mixture of light emitted from a plurality of light emitting diodes.

Description of the Related Art

Currently, as technology enters a full-scale information era, a field of a display apparatus which visually expresses electrical information signals has been rapidly developed and studies are continued to improve performances of various display apparatuses such as a thin-thickness, a light weight, and low power consumption.

Among various types of display apparatuses, an organic display apparatus is a self-emitting display apparatus so that a separate light source is not necessary, which is different from the liquid crystal display apparatus. Therefore, the light emitting display apparatus may be manufactured to have a light weight and a small thickness. Further, since the organic display apparatus is driven at a low voltage, it is advantageous not only in terms of power consumption, but also in terms of color implementation, response speed, viewing angle, and contrast ratio, so that the light emitting display apparatus is being studied as next generation displays.

SUMMARY

An object to be achieved by the present disclosure is to provide a display apparatus which may reduce a leakage current when the display apparatus is driven.

Another object to be achieved by the present disclosure is to provide a display apparatus which reduces emission of some of light emitting diodes among a plurality of light emitting diodes having a common layer due to a leakage current.

Still another object to be achieved by the present disclosure is to provide a display apparatus which improves an image display quality at a low gray scale.

Objects of the present disclosure are not limited to the above-mentioned objects, and other objects, which are not mentioned above, can be clearly understood by those skilled in the art from the following descriptions.

According to an aspect of the present disclosure, a display apparatus includes a substrate in which a plurality of sub pixels are defined; a plurality of light emitting diodes which are disposed in the plurality of sub pixels, the plurality of light emitting diodes having an organic layer shared between the plurality of light emitting diodes and a cathode electrode shared between the plurality of light emitting diodes; a bank disposed below the cathode electrode and between pairs of light emitting diodes from the plurality of light emitting diodes; a plurality of wiring lines disposed between the bank and the substrate; and a first pattern through a thickness of the bank, the first pattern overlapping a first wiring line from the plurality of wiring lines, wherein a first portion of the cathode electrode is disposed outside of the first pattern and a second portion of the cathode electrode is disposed in the first pattern. Accordingly, the length of the cathode electrode and the organic layer in the first pattern are increased so that the length of the path through which the leakage current flows is increased, which may reduce the degradation of the display quality due to the leakage current.

In one embodiment, a display apparatus comprises: a substrate in which a plurality of sub pixels are defined; a plurality of light emitting diodes which are disposed in the plurality of sub pixels, the plurality of light emitting diodes having an organic layer shared between the plurality of light emitting diodes and a cathode electrode shared between the plurality of light emitting diodes; a bank disposed below the cathode electrode and between pairs of light emitting diodes from the plurality of light emitting diodes; and a wiring line disposed between the bank and the substrate; wherein a first portion of the cathode electrode that overlaps the wiring line and is closer to the wiring line than a second portion of the cathode electrode that is non-overlapping with the wiring line.

Other detailed matters of the exemplary embodiments are included in the detailed description and the drawings.

According to the present disclosure, the leakage of the current through the common layer of the plurality of light emitting diodes may be improved.

According to the present disclosure, when the display apparatus is driven, emission of unintended light emitting diodes is reduced to improve color reproduction rate.

According to the present disclosure, the display quality may be improved by minimizing visual recognition of spots or color abnormalities when images of low gray scales are displayed.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
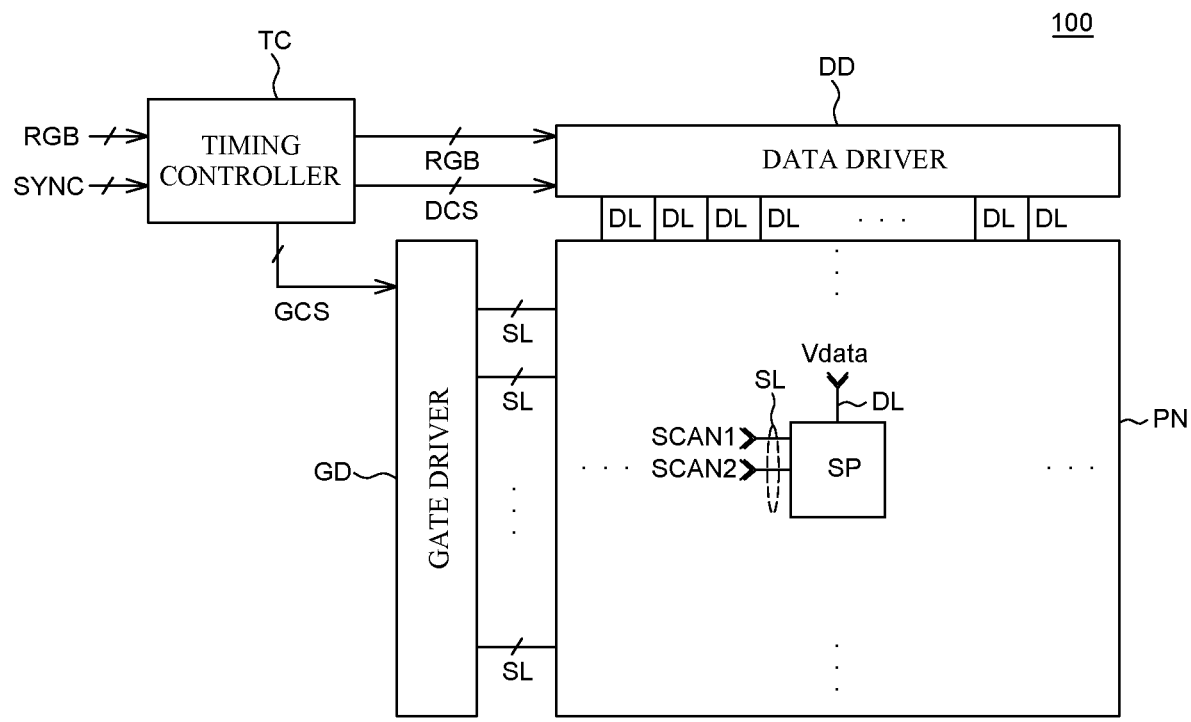
FIG. 1 is a schematic diagram of a display apparatus according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display apparatus according to exemplary embodiments of the present disclosure will be described in detail with reference to accompanying drawings.

FIG. 1 is a schematic diagram of a display apparatus according to an exemplary embodiment of the present disclosure. In FIG. 1, for the convenience of description, among various components of the display apparatus 100, a display panel PN, a gate driver GD, a data driver DD, and a timing controller TC are illustrated.

Referring to FIG. 1, the display apparatus 100 includes the display panel PN including a plurality of sub pixels SP, the gate driver GD, and the data driver DD which supply various signals to the display panel PN, and the timing controller TC which controls the gate driver GD and the data driver DD.

The gate driver GD supplies a plurality of scan signals to a plurality of scan lines SL in accordance with a plurality of gate control signals GCS supplied from the timing controller TC. The plurality of scan signals may include a first scan signal SCAN1 and a second scan signal SCAN2. Even though in FIG. 1, one gate driver GD is disposed to be spaced apart from one side of the display panel PN, the gate driver GD may be disposed in a gate in panel (GIP) manner and the number of gate drivers GD and the placement thereof are not limited thereto.

The data driver DD converts image data RGB input from the timing controller TC in accordance with a plurality of data control signals DCS supplied from the timing controller TC into a data voltage using a reference gamma voltage. Further, the data driver DD may supply the converted data voltage to the plurality of data lines DL.

The timing controller TC aligns image data RGB input from the outside to supply the image data to the data driver DD. The timing controller TC may generate a gate control signal GCS and a data control signal DCS using synchronization signals SYNC input from the outside, such as a dot clock signal, a data enable signal, and a horizontal/vertical synchronization signal. Further, the timing controller TC supplies the generated gate control signal GCS and data control signal DCS to the gate driver GD and the data driver DD, respectively, to control the gate driver GD and the data driver DD.

The display panel PN is a configuration which displays images to the user and includes the plurality of sub pixels SP. In the display panel PN, the plurality of scan lines SL and the plurality of data lines DL intersect each other and the plurality of sub pixels SP are connected to the scan lines SL and the data line DL, respectively. Even though not illustrated in the drawings, the plurality of sub pixels SP may be connected to a high potential power line, a low potential power line, an initialization signal line, and an emission control signal line.

The plurality of sub pixels SP is a minimum unit which configures a screen and each of the plurality of sub pixels SP may include a light emitting diode and a driving circuit for driving the light emitting diode. The plurality of light emitting diodes may be defined in different ways depending on a type of the display panel PN. For example, when the display panel PN is an organic light emitting display panel, the light emitting diode may be an organic light emitting diode which includes an anode, an organic layer, and a cathode. In addition to this, as the light emitting diode, a quantum-dot light emitting diode (QLED) including quantum dots (QD) may be further used. Hereinafter, even though the description will be made under the assumption that the light emitting diode is the organic light emitting diode, the type of the light emitting diode is not limited thereto.

A pixel circuit is a circuit for controlling the driving of the light emitting diode. For example, the pixel circuit may be configured to include a plurality of transistors and a capacitor, but is not limited thereto.

Hereinafter, the pixel circuit of the sub pixel SP will be described in more detail with reference to FIG. 2.

Figure 2:
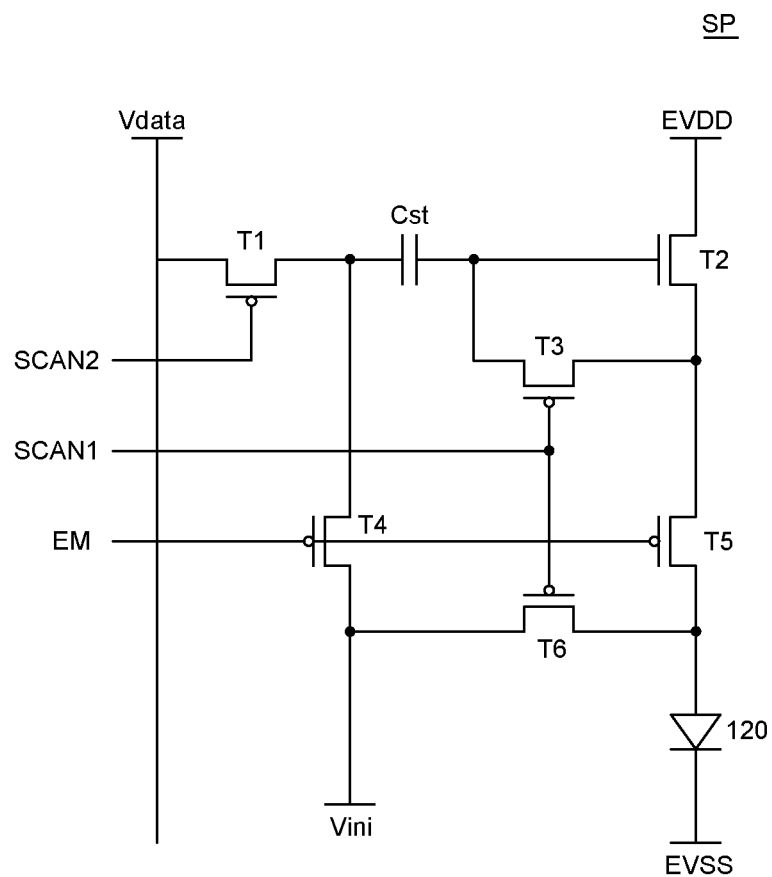
FIG. 2 is a circuit diagram of a sub pixel of a display apparatus according to an exemplary embodiment of the present disclosure.

FIG. 2 is a circuit diagram of a sub pixel of a display apparatus according to an exemplary embodiment of the present disclosure.

Referring to FIG. 2, the pixel circuit of the plurality of sub pixels SP includes first to sixth transistors T1, T2, T3, T4, T5, and T6 and a capacitor Cst.

The first transistor T1 is connected to a second scan line to be controlled by a second scan signal SCAN2 supplied through the second scan line. Further, the first transistor T1 may be electrically connected between a data line which supplies a data voltage Vdata and the capacitor Cst. When a turn-on level second scan signal SCAN2 is applied to the first transistor T1 through the second scan line, the first transistor T1 transmits the data voltage Vdata from the data line to the capacitor Cst. The first transistor T1 may be referred to as a switching transistor which controls a timing at which the data voltage Vdata is applied to the capacitor Cst.

The second transistor T2 may be electrically connected between the high potential power line to which a high potential power signal EVDD is supplied and the fifth transistor T5. Further, a gate electrode of the second transistor T2 may be electrically connected to the capacitor Cst. The second transistor T2 may be referred to as a driving transistor which controls a current flowing through the light emitting diode 120 in accordance with a voltage applied to the gate electrode to control a luminance of the light emitting diode 120.

The third transistor T3 may be controlled by the first scan signal SCAN1 supplied through a first scan line. The third transistor T3 may be electrically connected between the gate electrode and a drain electrode of the second transistor T2 or between the gate electrode and the source electrode, depending on the type of the second transistor T2 and the third transistor T3.

In the meantime, the second transistor T2 serving as the driving transistor needs to control the current flowing through the light emitting diode 120 in accordance with the data voltage Vdata applied to the sub pixel SP. However, a luminance deviation of the light emitting diode 120 disposed in each sub pixel SP may be caused by a threshold voltage deviation of the second transistor T2 disposed in every sub pixel SP.

At this time, the third transistor T3 is disposed to compensate for the threshold voltage deviation of the second transistor T2 so that the third transistor T3 may be referred to as a compensation transistor. For example, when the first scan signal SCAN1 which turns on the third transistor T3 is applied, a voltage obtained by subtracting the threshold voltage of the second transistor T2 from the high potential power signal EVDD is applied to the gate electrode of the second transistor T2. Further, in a state in which the high potential power signal EVDD from which the threshold voltage is subtracted is applied to the gate electrode of the second transistor T2, the data voltage Vdata is applied to the capacitor Cst to compensate for the threshold voltage deviation of the second transistor T2.

In the meantime, it is illustrated that the third transistor T3 and the first transistor T1 are applied with different scan signals SCAN1 and SCAN2 from different scan lines. However, the third transistor T3 and the first transistor T1 may be connected to the same scan line and may be applied with the same scan signals SCAN1 and SCAN2, and they are not limited thereto.

The fourth transistor T4 may be electrically connected to the capacitor Cst and the initialization signal line to which an initialization signal Vini is supplied. Further, the fourth transistor T4 may be controlled by an emission control signal EM supplied through the emission control signal line. When a turn-on level emission control signal EM is applied through the emission control signal line, the fourth transistor T4 may initialize the voltage of the capacitor Cst or slowly discharge the data voltage Vdata applied to the capacitor Cst to allow the current in accordance with the data voltage Vdata to flow through the light emitting diode 120.

The fifth transistor T5 is electrically connected between the second transistor T2 and the light emitting diode 120 and may be controlled by the emission control signal EM supplied through the emission control signal line. When a turn-on level emission control signal EM is applied in a state in which the data voltage Vdata is applied to the capacitor Cst and a high potential power signal EVDD in which the threshold voltage is compensated is applied to the gate electrode of the second transistor T2, the fifth transistor T5 is turned on. Therefore, the current may flow through the light emitting diode 120.

The sixth transistor T6 is electrically connected between the initialization signal line through which the initialization signal Vini is supplied and an anode of the light emitting diode 120 and is controlled by the first scan signal SCAN1 supplied through the first scan line. When a turn-on level first scan signal SCAN1 is applied through the first scan line, the sixth transistor T6 may initialize the anode of the light emitting diode 120 or a node between the second transistor T2 and the fifth transistor T5, with the initialization signal Vini.

The capacitor Cst may be a storage capacitor which stores a voltage applied to the gate electrode of the second transistor T2 serving as a driving transistor. Here, the capacitor Cst is electrically connected between the gate electrode of the second transistor T2 and the anode of the light emitting diode 120. Accordingly, the capacitor Cst may store a difference between the voltage of the gate electrode of the second transistor T2 and a voltage applied to the anode of the light emitting diode 120.

Hereinafter, the sub pixel SP of the display apparatus 100 according to the exemplary embodiment of the present disclosure will be described in more detail with reference to FIGS. 3A and 3B.

Figure 3A:
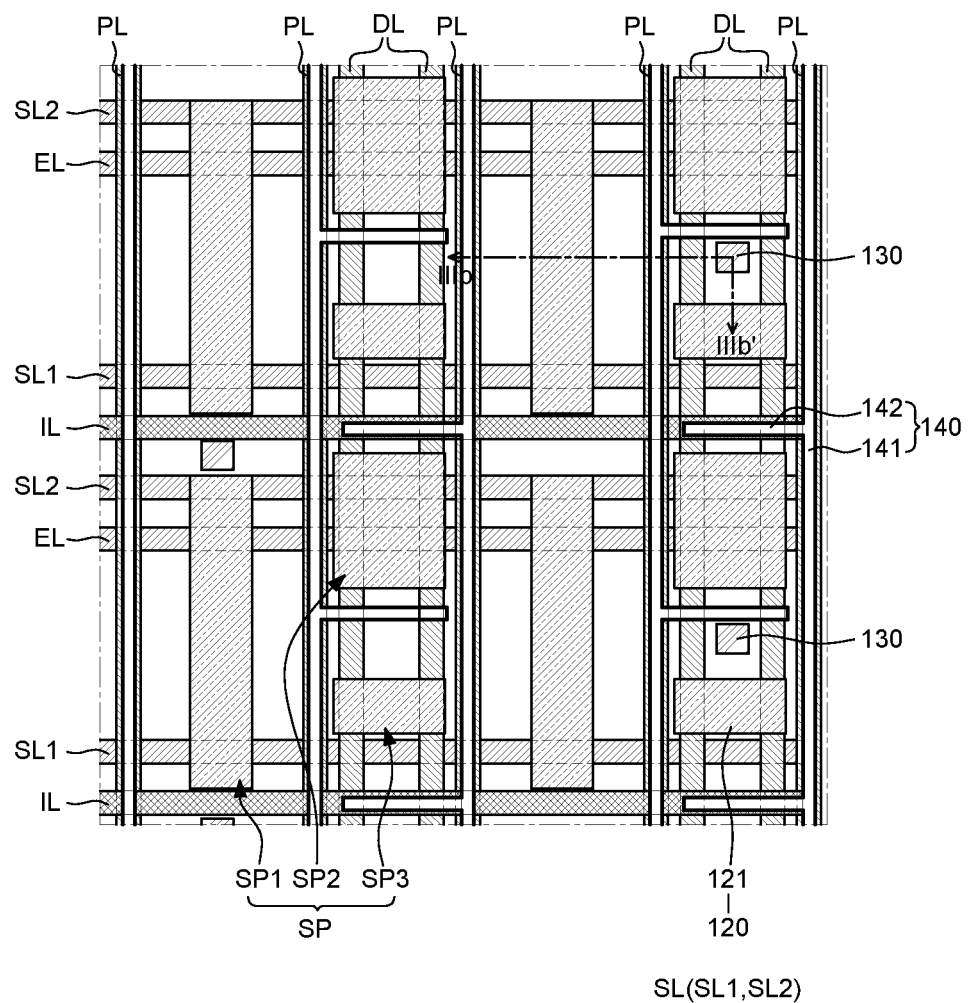
FIG. 3A is an enlarged plan view of a display apparatus according to an exemplary embodiment of the present disclosure.

FIG. 3A is an enlarged plan view of a display apparatus according to an exemplary embodiment of the present disclosure. FIG. 3B is a cross-sectional view taken along IIIb-IIIb' of FIG. 3A according to one embodiment. Referring to FIGS. 3A and 3B, the display apparatus 100 according to the exemplary embodiment of the present disclosure includes a substrate 110, a buffer layer 111, a gate insulating layer 112, an interlayer insulating layer 113, a passivation layer 114, a planarization layer 115, a bank 116, a high potential power line PL, a plurality of scan lines SL, a data line DL, an initialization signal line IL, an emission control signal line EL, a fifth transistor T5, a light emitting diode 120, a spacer 130, and a plurality of first patterns 140. In FIG. 3A, for the convenience of description, only the anode 121 among configurations of the light emitting diode 120 is illustrated. Further, in FIG. 3B, for the convenience of description, only the fifth transistor T5 among the plurality of transistors T1, T2, T3, T4, T5, and T6 and the capacitor Cst of the pixel circuit is illustrated.

Referring to FIG. 3A, the plurality of sub pixels SP are individual units which emit light and a respective light emitting diode 120 is disposed in each of the plurality of sub pixels SP. The plurality of sub pixels SP includes a first sub pixel SP1, a second sub pixel SP2, and a third sub pixel SP3 which emit different color light. For example, the first sub pixel SP1 is a blue sub pixel, the second sub pixel SP2 is a green sub pixel, and the third sub pixel SP3 is a red sub pixel.

The plurality of first sub pixels SP1 may be disposed to form a plurality of columns. That is, the plurality of first sub pixels SP1 may be disposed on the same column. Further, the plurality of second sub pixels SP2 and the plurality of third sub pixels SP3 may be disposed between the plurality of columns on which the plurality of first sub pixels is disposed in one embodiment. For example, the plurality of first sub pixels SP1 is disposed on one column and the second sub pixels SP2 and the third sub pixels SP3 may be disposed together on an adjacent column. Further, the plurality of second sub pixels SP2 and the plurality of third sub pixels SP3 may be alternately disposed on the same column. In this specification, it is described that the plurality of sub pixels SP includes the first sub pixel SP1, the second sub pixel SP2, and the third sub pixel SP3. However, the placement, the number and a color combination of the plurality of sub pixels SP may vary in various ways depending on a design and are not limited thereto.

The high potential power lines PL extending in a column direction are disposed between the plurality of sub pixels SP. The plurality of high potential power lines PL is wiring lines which transmit the high potential power signal EVDD to each of the plurality of sub pixels SP. Each of the plurality of high potential power lines PL may be disposed between the first sub pixel SP1 and the second sub pixel SP2 and between the first sub pixel SP1 and the third sub pixel SP3.

Similar to the plurality of high potential power lines PL, the plurality of data lines DL are disposed to extend in the column direction. The plurality of data lines DL are wiring lines which transmit the data voltage Vdata to the plurality of sub pixels SP. Each of the plurality of data lines DL may be disposed between the second sub pixel SP2 and the high potential power line PL and between the third sub pixel SP3 and the high potential power line PL. However, the plurality of data lines DL may also be disposed between the plurality of high potential power lines PL and the first sub pixels SP, but is not limited thereto.

The plurality of scan lines SL which extends in the row direction is disposed. The plurality of scan lines SL are wiring lines which transmit the scan signals SCAN1 and SCAN2 to the plurality of sub pixels SP. The plurality of scan lines SL includes a first scan line SL1 and a second scan line SL2. The first scan line SL1 is disposed to extend in a row direction between the second sub pixel SP2 and the third sub pixel SP3 and the second scan line SL2 may be disposed to extend in a row direction across the second sub pixel SP2.

The plurality of initialization signal lines IL that extend in the row direction similar to the plurality of scan lines SL are disposed between the plurality of sub pixels SP. The plurality of initialization signal lines IL are wiring lines that transmit the initialization signal Vini to the plurality of sub pixels SP. The plurality of initialization signal lines IL may be disposed between the second sub pixel SP2 and the third sub pixel SP3. The plurality of initialization signal lines IL may be disposed between the first scan line SL1 and the second scan line SL2.

The plurality of emission control signal lines EL are disposed to extend in the row direction similar to the plurality of scan lines SL. The plurality of emission control signal lines EL are wiring lines which transmit the emission control signal EM to the plurality of sub pixels SP. The plurality of emission control signal lines EL may be disposed to be adjacent to the plurality of second scan lines SL2. The plurality of emission control signal lines EL may be disposed to extend in a row direction across the second sub pixel SP2. The second scan line SL2 may be disposed between the plurality of emission control signal lines EL and the plurality of initialization signal lines IL.

In the meantime, the plurality of wiring lines may be classified into a direct current (DC) line which transmits a DC signal and an alternating current (AC) line which transmits an AC signal. Among the plurality of wiring lines, the high potential power line PL and the initialization signal line IL which transmit the high potential power signal EVDD and the initialization signal Vini which are DC signals may be included in the DC line. Further, among the plurality of wiring lines, the scan line SL and the data line DL which transmit the scan signals SCAN1 and SCAN2 and the data voltage Vdata which are AC signals may be included in the AC line.

A plurality of spacers 130 are disposed between the plurality of sub pixels SP. When the light emitting diode 120 is formed in the plurality of sub pixels SP, a fine metal mask (FMM) may be used as a deposition mask. At this time, in order to suppress a damage which may be generated due to the contact with the deposition mask and maintain a predetermined distance between the deposition mask and the substrate 110, the plurality of spacers 130 may be disposed.

The plurality of first patterns 140 is disposed between the plurality of sub pixels SP. At least a part of the plurality of first patterns 140 may be disposed to overlap the DC line which transmits a DC signal, among the plurality of wiring lines.

The plurality of first patterns 140 includes a first part 141 and a second part 142. The first part 141 is a part extending in a column direction between the plurality of sub pixels SP. The first part 141 may be a part extending in a column direction, between the first sub pixel SP1 and the second sub pixel SP2 and between the first sub pixel SP1 and the third sub pixel SP3. Further, at least a part of the first part 141 may overlap the DC line extending in the column direction, among the DC lines. For example, the first part 141 extends in the column direction to overlap the high potential power line PL which is a DC line.

The second part 142 is a part extending in a row direction between the plurality of sub pixels SP. The second part 142 may be a part extending in a row direction, between the second sub pixel SP2 and the third sub pixel SP3 and between the first sub pixel SP1 and the first sub pixel SP1. At this time, the second part 142 may extend in the row direction from the first part 141 or may be disposed to be separated from the first part 141. Further, at least a part of the second part 142 may overlap the DC line extending in the row direction, among the DC lines. For example, at least a part of the second part 142 extending in the row direction may be disposed to overlap the initialization signal line IL which is a DC line.

The leakage current from the plurality of light emitting diodes 120 may be reduced by the plurality of first patterns 140 which are disposed to overlap the DC line between the plurality of sub pixels SP, which will be described in more detail with reference to FIG. 3B.

Figure 3B:
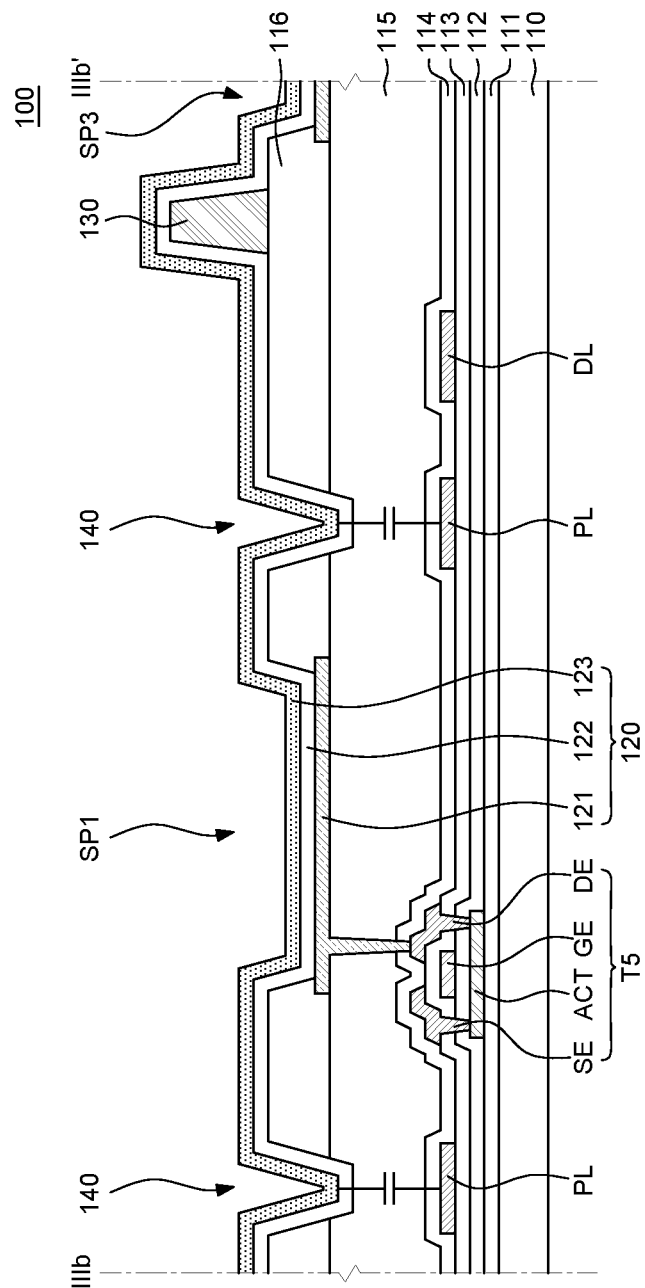
FIG. 3B is a cross-sectional view taken along IIIb-IIIb' of FIG. 3A according to an exemplary embodiment of the present disclosure.

Referring to FIG. 3B, the substrate 110 is a support member for supporting other components of the display apparatus 100 and may be configured by an insulating material. For example, the substrate 110 may be formed of glass or resin. Further, the substrate 110 may be configured to include plastics such as polymer or polyimide (PI) or may be formed of a material having flexibility.

The buffer layer 111 is disposed on the substrate 110. The buffer layer 111 may reduce permeation of moisture or impurities from the substrate 110. The buffer layer 111 may be configured by a single layer or a double layer of silicon oxide SiOx or silicon nitride SiNx, but is not limited thereto. However, the buffer layer 111 may be omitted depending on a type of substrate 110 or a type of transistor, but is not limited thereto.

The fifth transistor T5 is disposed on the buffer layer 111. The fifth transistor T5 includes an active layer ACT, a gate electrode GE, a source electrode SE, and a drain electrode DE.

The active layer ACT may be formed of a semiconductor material such as an oxide semiconductor, amorphous silicon, or polysilicon, but is not limited thereto. For example, when the active layer ACT is formed of an oxide semiconductor, the active layer ACT is formed by a channel region, a source region, and a drain region and the source region and the drain region may be conductive regions, but are not limited thereto.

The gate insulating layer 112 is disposed on the active layer ACT. The gate insulating layer 112 is an insulating layer which insulates the active layer ACT from the gate electrode GE and may be configured by a single layer or a double layer of silicon oxide SiOx or silicon nitride SiNx, but is not limited thereto.

The gate electrode GE is disposed on the gate insulating layer 112. The gate electrode GE may be configured by a conductive material such as copper (Cu), aluminum (Al), molybdenum (Mo), nickel (Ni), titanium (Ti), chrome (Cr), or an alloy thereof, but is not limited thereto.

The interlayer insulating layer 113 is disposed on the gate electrode GE. In the interlayer insulating layer 113, a contact hole through which the source electrode SE and the drain electrode DE are connected to the active layer ACT is formed. The interlayer insulating layer 113 may be configured by a single layer or a double layer of silicon oxide SiOx or silicon nitride SiNx, but is not limited thereto.

The source electrode SE and the drain electrode DE are disposed on the interlayer insulating layer 113. The source electrode SE and the drain electrode DE which are disposed to be spaced apart from each other may be electrically connected to the active layer ACT. The source electrode SE and the drain electrode DE may be configured by a conductive material, such as copper (Cu), aluminum (Al), molybdenum (Mo), nickel (Ni), titanium (Ti), chrome (Cr), or an alloy thereof, but are not limited thereto.

The high potential power line PL and the data line DL are disposed on the interlayer insulating layer 113. The high potential power line PL and the data line DL are disposed on the same layer as the source electrode SE and the drain electrode DE and are formed of the same conductive material, but are not limited thereto. For example, the high potential power line PL and the data line DL may be configured by a conductive material such as copper (Cu), aluminum (Al), molybdenum (Mo), nickel (Ni), titanium (Ti), chrome (Cr), or an alloy thereof, but are not limited thereto.

The passivation layer 114 is disposed on the high potential power line PL, the data line DL, the source electrode SE, and the drain electrode DE. The passivation layer 114 is an insulating layer for protecting components below the passivation layer 114. For example, the passivation layer 114 may be configured by a single layer or a double layer of silicon oxide SiOx or silicon nitride SiNx, but is not limited thereto. Further, the passivation layer 114 may be omitted depending on the exemplary embodiment.

The planarization layer 115 is disposed on the passivation layer 114. The planarization layer 115 is an insulating layer which planarizes an upper portion of the substrate 110. The planarization layer 115 may be formed of an organic material, and for example, may be configured by a single layer or a double layer of polyimide or photo acryl, but is not limited thereto.

The plurality of light emitting diodes 120 is disposed in each of the plurality of sub pixels SP on the planarization layer 115. The light emitting diode 120 includes an anode 121, an organic layer 122, and a cathode 123.

The anode 121 is disposed on the planarization layer 115. The anode 121 is electrically connected to a transistor of the pixel circuit, for example, the second transistor T2 and the fifth transistor T5 to be supplied with a driving current. The anode 121 supplies holes to the organic layer 122 so that the anode 121 may be formed of a conductive material having a high work function. For example, the anode 121 may be formed of a transparent conductive material such as indium tin oxide (ITO) and indium zinc oxide (IZO), but is not limited thereto.

In the meantime, the display apparatus 100 may be implemented by a top emission type or a bottom emission type. When the display apparatus 100 is a top emission type, a reflective layer which is formed of a metal material having an excellent reflection efficiency such as aluminum (Al) or silver (Ag), may be added below the anode 121. Therefore, light emitted from the organic layer 122 is reflected from the anode 121 to be directed to the upper direction, that is, the cathode 123. In contrast, when the display apparatus 100 is a bottom emission type, the anode 121 may be only formed of a transparent conductive material. Hereinafter, the description will be made under the assumption that the display apparatus 100 according to the exemplary embodiment of the present disclosure is a top emission type.

The bank 116 is disposed on the anode 121 and the planarization layer 115. The bank 116 is an insulating layer disposed between the plurality of sub pixels SP to divide the plurality of sub pixels SP. The bank 116 includes an opening which exposes a part of the anode 121. The bank 116 may be an organic insulating material disposed to cover an edge or a border of the anode 121. For example, the bank 116 may be formed of polyimide resin, acrylic resin, or benzocyclobutene (BCB)-based resin, but is not limited thereto.

The spacer 130 is disposed on the bank 116. The spacer 130 is disposed on the bank 116 to maintain a predetermined distance from the deposition mask when the light emitting diode 120 is formed. The spacer 130 may allow the bank 116 and the anode 121 below the deposition mask and the spacer 130 to maintain a predetermined distance from the deposition mask and suppress the damage due to the contact. At this time, the plurality of spacers 130 may be formed to have a shape which is narrower toward the upper portion, for example, a tapered shape, to reduce an area which is in contact with the deposition mask.

The organic layer 122 is disposed on the anode 121, the bank 116, and the spacer 130. The organic layer 122 includes a light emitting layer and a common layer. The light emitting layer is an organic layer which emits light having a specific color so that different light emitting layers may be disposed on the first sub pixel SP1, the second sub pixel SP2, and the third sub pixel SP3 or the same light emitting layer may be disposed on all the plurality of sub pixels SP. For example, when different light emitting layers are disposed on the plurality of sub pixels SP, a blue light emitting layer is disposed in the first sub pixel SP1, a green light emitting layer is disposed in the second sub pixel SP2, and a red light emitting layer may be disposed in the third sub pixel SP3. Further, the light emitting layers of the plurality of sub pixels SP are connected to each other to be formed as one layer over the plurality of sub pixels SP. For example, the light emitting layers are disposed on all the plurality of sub pixels SP and light from the light emitting layers may be converted into various color light by means of a separate light converting layer, a color filter, or the like.

Further, a plurality of light emitting layers which emits the same color light may be laminated on one sub pixel SP. For example, two blue light emitting layers are laminated on the first sub pixel SP1, two green light emitting layers are laminated on the second sub pixel SP2, and two red light emitting layers may be laminated on the third sub pixel SP3. In this case, a charge generation layer CGL is disposed between the plurality of light emitting layers to smoothly supply electrons or holes to each of the plurality of light emitting layers. That is, the charge generation layer may be disposed between two blue light emitting layers, between two green light emitting layers, and between two red light emitting layers.

Further, a plurality of light emitting layers which emit different color light may be laminated on one sub pixel SP. For example, the blue light emitting layer and the yellow-green light emitting layer are laminated on all the plurality of sub pixels SP so that all the plurality of sub pixels SP may implement white light. In this case, the charge generation layer may be disposed between the blue light emitting layer and the yellow-green light emitting layer.

The common layer is an organic layer 122 which is disposed to improve an emission efficiency of the light emitting layer. The common layer may be formed as one layer over the plurality of sub pixels SP. That is, the common layers of the plurality of sub pixels SP are connected to be integrally formed. The common layer may include a charge generation layer, a hole injection layer, a hole transport layer, an electron transport layer, or an electron injection layer, but is not limited thereto.

The cathode 123 is disposed on the organic layer 122. The cathode 123 supplies electrons to the organic layer 122 so that the cathode 123 may be formed of a conductive material having a low work function. The cathode 123 may be formed as one layer over the plurality of sub pixels SP. That is, the cathodes 123 of the plurality of sub pixels SP are connected to be integrally formed. For example, the cathode 123 may be formed of a transparent conductive material such as indium tin oxide (ITO) and indium zinc oxide (IZO), or metal alloy such as MgAg or ytterbium (Yb) alloy and may further include a metal doping layer, but is not limited thereto. In the meantime, even though not illustrated in the drawing, the cathode 123 is electrically connected to the low potential power line to be supplied with a low potential power signal EVSS.

A plurality of first patterns 140 are disposed in the bank 116. The plurality of first patterns 140 may be trenches formed in the bank 116 between the plurality of sub pixels SP. The plurality of first patterns 140 may be trenches formed from the bank 116 to the planarization layer 115 below the bank 116. However, the plurality of first patterns 140 may be formed only in the bank 116, but is not limited thereto. Further, even though in FIG. 3B, it is illustrated that the plurality of first patterns 140 are V-shaped trenches, the plurality of first patterns 140 may be formed with various shapes, but is not limited thereto.

At least some of the plurality of first patterns 140 may be disposed to overlap the plurality of wiring lines. For example, at least some of the plurality of first patterns 140 may be disposed to overlap the DC line such as the high potential power line PL, among the plurality of wiring lines.

In the meantime, the common layer of the plurality of light emitting diodes 120 may be formed as one layer over all the plurality of sub pixels SP. At this time, as the light emitting diodes 120 of the plurality of sub pixels SP is formed to share the common layer, when a light emitting diode 120 of a specific sub pixel SP emits light, a phenomenon that the current flows to a light emitting diode 120 of an adjacent sub pixel SP, that is, current leakage phenomenon may occur. The current leakage phenomenon causes the light emitting diode 120 of unintended sub pixel SP to emit light, which causes color mixture between the plurality of sub pixels SP and increases the power consumption. Further, color abnormality and spot defect are visibly recognized due to the leakage current so that display quality is degraded. For example, when only the first sub pixel SP1 among the plurality of sub pixels SP emits light, a part of the current supplied to drive the light emitting diode 120 of the first sub pixel SP1 may leak to the second sub pixel SP2 and the third sub pixel SP3 which are adjacent to the first sub pixel SP1 by means of the common layer.

Further, light emitting layers which are separately disposed for each of the plurality of sub pixels SP have different turn-on voltages. For example, a turn-on voltage for driving the first sub pixel SP1 on which the blue light emitting layer is disposed is the highest turn-on voltage and a turn-on voltage for driving the third sub pixel SP3 on which the red light emitting layer is disposed is the lowest turn-on voltage. A barrier through which the current flows is low in the second sub pixel SP2 and the third sub pixel SP3 having a turn-on voltage lower than that of the first sub pixel SP1 having the highest turn-on voltage. Therefore, the current leaked through the common layer may easily flow from the first sub pixel SP1 having the higher turn-on voltage to the second sub pixel SP2 and the third sub pixel SP3 having a lower turn-on voltage. As a result, when the first sub pixel SP1 is driven, the second sub pixel SP2 and the third sub pixel SP3 having a low turn-on voltage may emit light together.

Specifically, during the low gray scale driving, a luminance of light emitted from a sub pixel SP which is being driven is low so that light emitted from the adjacent sub pixels SP may be more easily recognized. That is, during the low gray scale driving, color abnormality and spot defect due to the leakage current are more easily recognized, which may cause serious degradation in display quality. Further, when white light with a low gray scale is displayed, the third sub pixel SP3 having the lowest turn-on voltage emits the light first through the common layer, so that reddish phenomenon that reddish white is displayed rather than pure white may occur.

Accordingly, in the display apparatus 100 according to the exemplary embodiment of the present disclosure, the plurality of first patterns 140 are disposed to reduce the leakage current through the common layer of the light emitting diode 120. First, the organic layer 122 and the cathode 123 of the plurality of light emitting diodes 120 are disposed on the bank 116 on which the plurality of first patterns 140 is formed so that the organic layer 122 and the cathode 123 may be disposed also in the plurality of first patterns 140. Since the organic layer 122 and the cathode 123 are deposited along the plurality of first patterns 140, a length of a path through which the leakage current flows may be increased. Since the common layer of the organic layer 122 which serves as the path of the leakage current is formed along the plurality of first patterns 140 and the bank 116, the length of the common layer may be increased and the length of the path of the leakage current may be increased. Therefore, the length of the organic layer 122 which serves as a path through which the leakage current flows is increased by the first pattern 140 which is a trench so that the resistance of the organic layer 122 is increased. By increasing the resistance of the organic layer 122, a voltage applied to adjacent subpixels is reduced to a level that is lower than the turn-on voltage of the adjacent subpixels, for example. Therefore, the leakage current which flows to the light emitting diode 120 of the adjacent sub pixel SP may be reduced.

Further, in the display apparatus 100 according to the exemplary embodiment of the present disclosure, carriers of the leakage current may be trapped by a capacitor formed by the cathode 123 and the DC line in the plurality of first patterns 140. Specifically, the plurality of first patterns 140 may be disposed to overlap the DC line. The distance between a portion of the cathode 123 that is disposed in a first pattern 140 that overlaps the DC line may be closer to the DC line than a portion of the cathode that is disposed outside of the first pattern 140 and non-overlapping with the DC line. In one embodiment, the plurality of first patterns 140 are grooves formed in the bank 116 and the planarization layer 115. Further, in the first pattern 140, the cathode 123 and the DC line, for example, the cathode 123 and the high potential power line PL or the cathode 123 and the initialization signal line IL may form a capacitor. If the first pattern 140 is not disposed, various insulating layers such as the bank 116 and the planarization layer 115 are disposed between the cathode 123 and the DC line such as the high potential power line PL or the initialization signal line IL. Therefore, the interval between the cathode 123 and the DC line is increased so that it is difficult to form a capacitor. However, in the display apparatus 100 according to the exemplary embodiment of the present disclosure, the first pattern 140 is formed in the bank 116 and the planarization layer 115 so that the distance between the cathode 123 and the DC line becomes close. Accordingly, the cathode 123 and the DC line may form the capacitor. Further, the carriers of the leakage current which flows to the adjacent sub pixel SP are trapped by the capacitor formed by the cathode 123 and the DC line so that the leakage current flowing to the adjacent sub pixel SP may be reduced.

In the meantime, when the plurality of first patterns 140 overlaps an AC line through which an AC signal flows, for example, the scan line SL and the data line DL, a capacitor may also be formed between the cathode 123 and the AC line. However, a magnitude and a direction of the AC signal change in accordance with a time so that the capacitor between the cathode 123 and the AC line may not be stably configured, and the carriers of the leakage current are hardly trapped by the capacitor. Therefore, in the display apparatus 100 according to the exemplary embodiment of the present disclosure, the plurality of first patterns 140 are disposed to overlap the DC line such as the high potential power line PL and the initialization signal line IL, but do not overlap the AC line. Therefore, the carriers of the leakage current may be stably trapped. Accordingly, in the display apparatus 100 according to the exemplary embodiment of the present disclosure, the first pattern 140 is disposed to overlap the DC line so that the leakage current which is transmitted to the adjacent sub pixel SP may be reduced.

Figure 4:
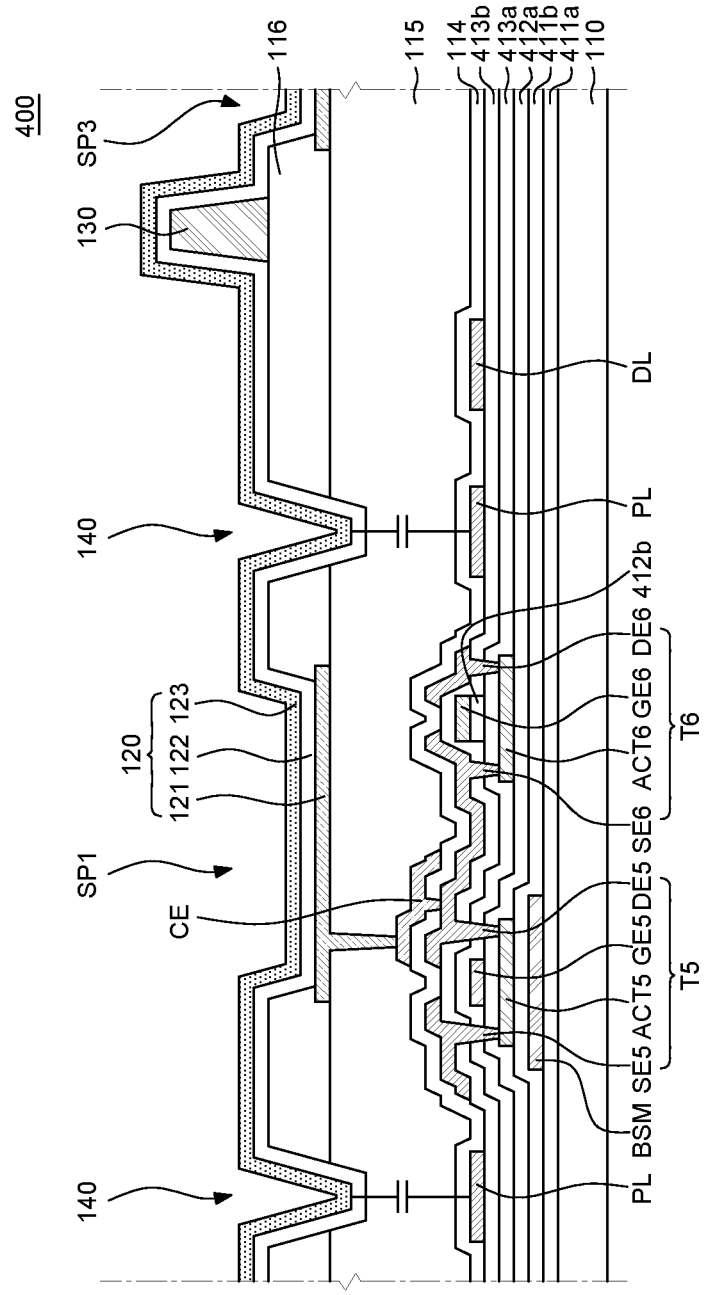
FIG. 4 is a cross-sectional view of a display apparatus according to another exemplary embodiment of the present disclosure.

FIG. 4 is a cross-sectional view of a display apparatus according to another exemplary embodiment of the present disclosure. As compared with the display apparatus 100 of FIGS. 1 to 3B, the only difference between a display apparatus 400 of FIG. 4 and the display apparatus 100 of FIGS. 1 to 3B is transistors T5 and T6, but the other configurations are substantially the same, so that a redundant description will be omitted.

Referring to FIG. 4, a first buffer layer 411a and a second buffer layer 411b are disposed on a substrate 110. The first buffer layer 411a and the second buffer layer 411b may reduce permeation of moisture or impurities from the substrate 110. The first buffer layer 411a and the second buffer layer 411b may be configured by a single layer or a double layer of silicon oxide SiOx or silicon nitride SiNx, but are not limited thereto. However, the first buffer layer 411a and the second buffer layer 411b may be omitted depending on a type of substrate 110 or a type of transistor, but are not limited thereto.

A light shielding layer BSM is disposed between the first buffer layer 411a and the second buffer layer 411b. The light shielding layer BSM is disposed to overlap a fifth active layer ACT5 of the fifth transistor T5 to be described below to protect the fifth transistor T5 from laser or light introduced from the outside or moisture introduced from the outside to reduce the deformation of the device characteristic of the fifth transistor T5. In the meantime, even though in FIG. 4, it is illustrated that the light shielding layer BSM is floated, the light shielding layer BSM may be electrically connected to the other configuration, for example, a plurality of wiring lines, but is not limited thereto.

The fifth transistor T5 is disposed on the second buffer layer 411b. The fifth transistor T5 includes a fifth active layer ACT5, a fifth gate electrode GE5, a fifth source electrode SE5, and a fifth drain electrode DE5.

The fifth active layer ACT5 is disposed on the second buffer layer 411b so as to overlap the light shielding layer BSM. The fifth active layer ACT5 may be formed of a low temperature poly silicon (LTPS). The poly silicon has a high mobility so that energy power consumption is low and a reliability is high. Therefore, a transistor which is formed of a poly silicon material may be applied to the driving transistor.

A first gate insulating layer 412a is disposed on the fifth active layer ACT5. The first gate insulating layer 412a is an insulating layer which insulates the fifth active layer ACT5 from the fifth gate electrode GE5 and may be configured by a single layer or a double layer of silicon oxide SiOx or silicon nitride SiNx, but is not limited thereto.

The fifth gate electrode GE5 is disposed on the first gate insulating layer 412a. The fifth gate electrode GE5 may be configured by a conductive material such as copper (Cu), aluminum (Al), molybdenum (Mo), nickel (Ni), titanium (Ti), chrome (Cr), or an alloy thereof, but is not limited thereto.

A first interlayer insulating layer 413a and a second interlayer insulating layer 413b are disposed on the fifth gate electrode GE5. Contact holes through which the fifth source electrode SE5 and the fifth drain electrode DE5 are connected to the fifth active layer ACT5 may be formed in the first interlayer insulating layer 413a and the second interlayer insulating layer 413b, respectively. The first interlayer insulating layer 413a and the second interlayer insulating layer 413b may be configured by a single layer or a double layer of silicon oxide SiOx or silicon nitride SiNx, but are not limited thereto.

The fifth source electrode SE5 and the fifth drain electrode DE5 are disposed on the second interlayer insulating layer 413b. The fifth source electrode SE5 and the fifth drain electrode DE5 which are disposed to be spaced apart from each other may be electrically connected to the fifth active layer ACT5. The fifth source electrode SE5 and the fifth drain electrode DE5 may be configured by a conductive material, such as copper (Cu), aluminum (Al), molybdenum (Mo), nickel (Ni), titanium (Ti), chrome (Cr), or an alloy thereof, but are not limited thereto.

A passivation layer 114 is disposed on the fifth source electrode SE5 and the fifth drain electrode DE5 and a connection electrode CE is disposed on the passivation layer 114. The connection electrode CE is a connection member which electrically connects the anode 121 to the fifth transistor T5 and the sixth transistor T6 and is disposed between the passivation layer 114 and the planarization layer 115. However, the connection electrode CE may be omitted and it is not limited thereto.

The sixth transistor T6 is disposed on the first gate insulating layer 412a. The sixth transistor T6 includes a sixth active layer ACT6, a sixth gate electrode GE6, a sixth source electrode SE6, and a sixth drain electrode DE6.

The sixth active layer ACT6 is disposed on the first gate insulating layer 412a. The sixth active layer ACT6 may be formed of an oxide semiconductor. The oxide semiconductor material has a band gap larger than that of silicon so that electrons cannot jump over the band gap in an off state. Therefore, the oxide semiconductor material has a low off-current. Accordingly, a transistor which is formed of an oxide semiconductor material may be applied to a switching transistor which has a short on-time and maintains a long off-time.

The first interlayer insulating layer 413a is disposed on the sixth active layer ACT6 and the second gate insulating layer 412b and the sixth gate electrode GE6 are disposed on the first interlayer insulating layer 413a. The second gate insulating layer 412b may be patterned in the same manner as the sixth gate electrode GE6. The second gate insulating layer 412b may be formed to correspond to the sixth gate electrode GE6, instead of being formed on the entire substrate 110. In FIG. 4, it is illustrated that the first gate insulating layer 412a is formed on the entire substrate 110 and the second gate insulating layer 412b is patterned by the same manner as the sixth gate electrode GE6. However, the second gate insulating layer 412b may be disposed on the entire substrate 110 or the first gate insulating layer 412a may be patterned by the same manner as the fifth gate electrode GE5, but is not limited thereto.

The sixth gate electrode GE6 may be configured by a conductive material such as copper (Cu), aluminum (Al), molybdenum (Mo), nickel (Ni), titanium (Ti), chrome (Cr), or an alloy thereof, but is not limited thereto.

A second interlayer insulating layer 413b is disposed on the sixth gate electrode GE6 and a sixth source electrode SE6 and a sixth drain electrode DE6 are disposed on the second interlayer insulating layer 413b. The sixth source electrode SE6 and the sixth drain electrode DE6 which are disposed to be spaced apart from each other may be electrically connected to the sixth active layer ACT6. The sixth source electrode SE6 and the sixth drain electrode DE6 may be configured by a conductive material, such as copper (Cu), aluminum (Al), molybdenum (Mo), nickel (Ni), titanium (Ti), chrome (Cr), or an alloy thereof, but are not limited thereto.

The fifth drain electrode DE5 of the fifth transistor T5 may be connected to the sixth source electrode SE6 of the sixth transistor T6. The fifth drain electrode DE5 and the sixth source electrode SE6 may be integrally formed. Accordingly, both the fifth transistor T5 and the sixth transistor T6 may be electrically connected to the anode 121 of the light emitting diode 120.

In the meantime, it is described in FIG. 4 that the fifth active layer ACT5 of the fifth transistor T5 is formed of a low temperature polysilicon and the sixth active layer ACT6 of the sixth transistor T6 is formed of an oxide semiconductor material. However, the fifth active layer ACT5 may be formed of an oxide semiconductor material or the sixth active layer ACT6 may be formed of a low temperature poly silicon, but are not limited thereto.

In the display apparatus 400 according to another exemplary embodiment of the present disclosure, the plurality of transistors T1, T2, T3, T4, T5, and T6 of the pixel circuit is configured by different types to improve the performance of the pixel circuit. The pixel circuit includes a plurality of transistors T1, T2, T3, T4, T5, and T6 and a capacitor Cst and the plurality of transistors T1, T2, T3, T4, T5, and T6 is formed of different types of transistors. For example, in some of the plurality of transistors T1, T2, T3, T4, T5, and T6, active layers are formed of a low temperature poly silicon and in the other of the transistors, the active layers may be formed of an oxide semiconductor material. The transistor including low temperature poly silicon has a high mobility and low power consumption so that the transistor may be applied as the driving transistor. The transistor including an oxide semiconductor material has a short on-time and maintains a long off-time so that the transistor may be applied as a switching transistor. Accordingly, in the display apparatus 400 according to another exemplary embodiment of the present disclosure, the active layers may be configured by different materials in consideration of the functions of the plurality of transistors T1, T2, T3, T4, T5, and T6 which configures the pixel circuit to improve the performance of the pixel circuit.

Figure 5:
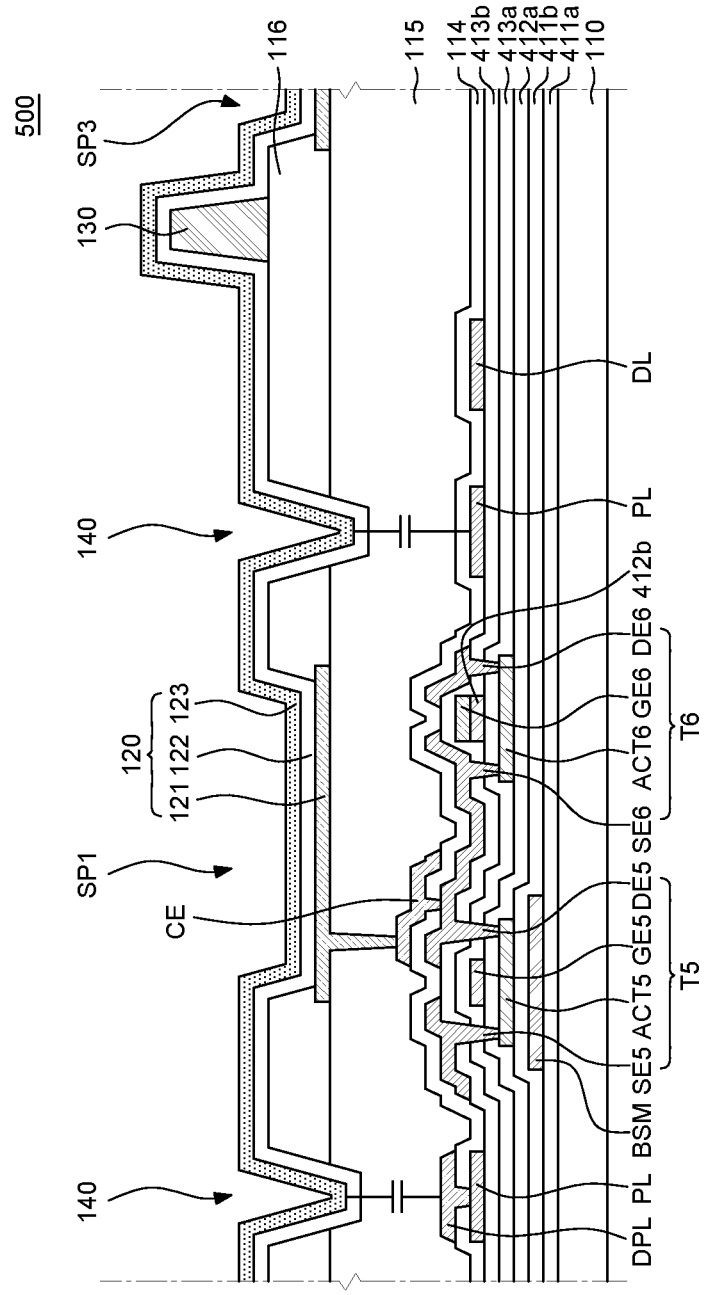
FIG. 5 is a cross-sectional view of a display apparatus according to still another exemplary embodiment of the present disclosure

FIG. 5 is a cross-sectional view of a display apparatus according to still another exemplary embodiment of the present disclosure. As compared with the display apparatus 400 of FIG. 4, a display apparatus 500 of FIG. 5 further includes a dummy line DPL, but the other configurations are substantially the same, so that a redundant description will be omitted.

Referring to FIG. 5, a passivation layer 114 is disposed on a high potential power line PL and a dummy line DPL is disposed on the passivation layer 114. The dummy line DPL is a line which is disposed at an uppermost portion among the plurality of wiring lines disposed on the substrate 110 and is disposed to overlap between the high potential power line PL and the first pattern 140. Further, the dummy line DPL is electrically connected to the high potential power line PL to be applied with a high potential power signal EVDD which is transmitted to the high potential power line PL, that is, a DC signal. Accordingly, the dummy line DPL which is electrically connected to the high potential power line PL and is disposed at the uppermost portion among the plurality of wiring lines on the substrate 110 may form a capacitor with the cathode 123 disposed in the first pattern 140.

In the display apparatus 500 according to still another exemplary embodiment of the present disclosure, a DC signal is applied to a wiring line which is disposed at the uppermost portion, among the wiring lines disposed on the substrate 110 to improve capacitance of the capacitor formed between the cathode 123 and the wiring line at the uppermost portion in the first pattern 140. A DC signal may flow in some wiring lines among a plurality of wiring lines disposed on the substrate 110. Further, the cathode 123 disposed in the first pattern 140 overlaps some of the DC lines through which the DC signal flows to form a capacitor. For example, the dummy line DPL which is disposed at the uppermost portion among the plurality of wiring lines and is electrically connected to the high potential power line PL may form a capacitor with the cathode 123 disposed in the first pattern 140. At this time, the shorter the distance between two electrodes which form the capacitor, the better the capacitance of the capacitor. Therefore, the capacitance of the capacitor formed by the cathode 123 disposed in the first pattern 140 and the dummy line DPL disposed at the uppermost portion among the wiring lines disposed on the substrate 110 may be larger than the embodiments shown in FIGS. 3B and 4. Further, when the capacitance of the capacitor is improved, the carriers of the leakage current which flows to the adjacent sub pixel SP may be easily trapped. Accordingly, in the display apparatus 500 according to still another exemplary embodiment of the present disclosure, the cathode 123 disposed in the first pattern 140 forms a capacitor with a wiring line which is disposed at the uppermost side among the wiring lines disposed on the substrate 110 and in which a DC signal flows, for example, a dummy line DPL. Therefore, more carriers of the leakage current which flows to the adjacent sub pixel SP may be trapped and visible recognition of color abnormality and spot defect due to the leakage current may be reduced.

Figure 6:
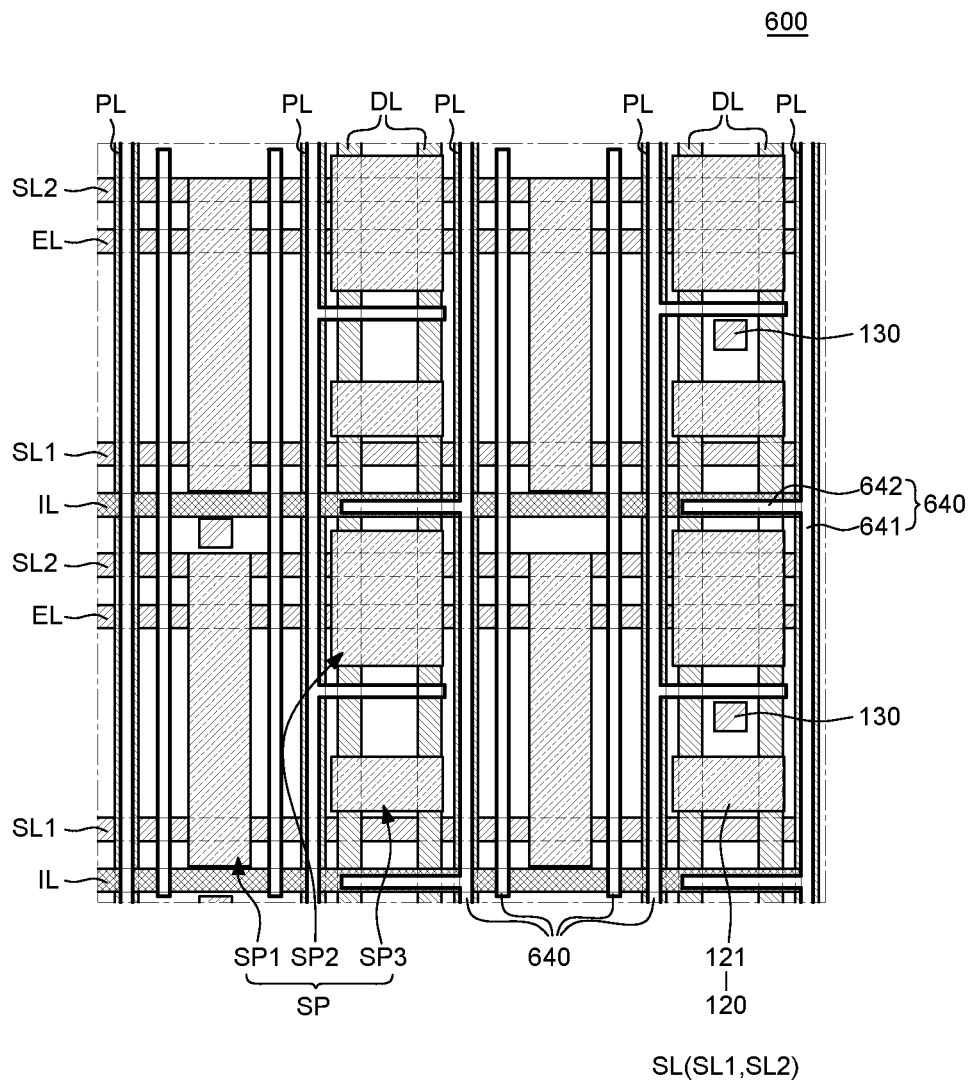
FIG. 6 is an enlarged plan view of a display apparatus according to still another exemplary embodiment of the present disclosure.
Figure 7A:
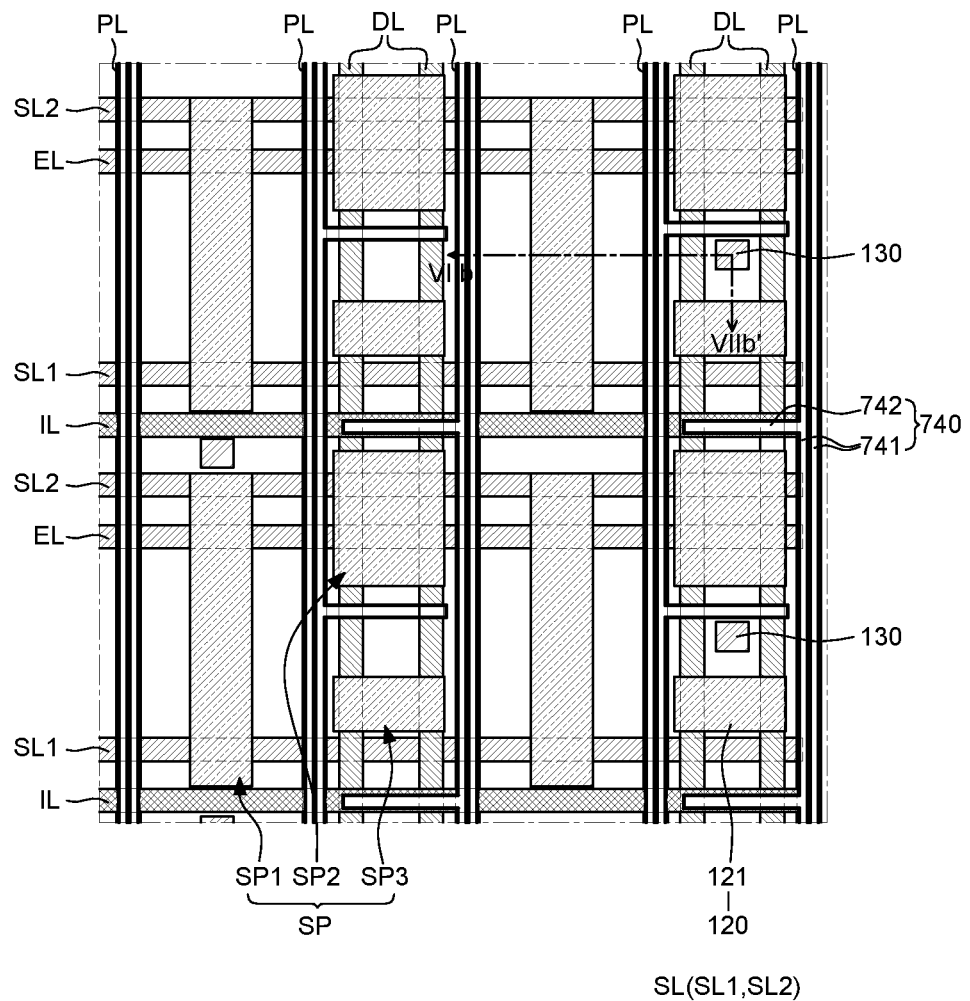
FIG. 7A is an enlarged plan view of a display apparatus according to still another exemplary embodiment of the present disclosure.
Figure 7B:
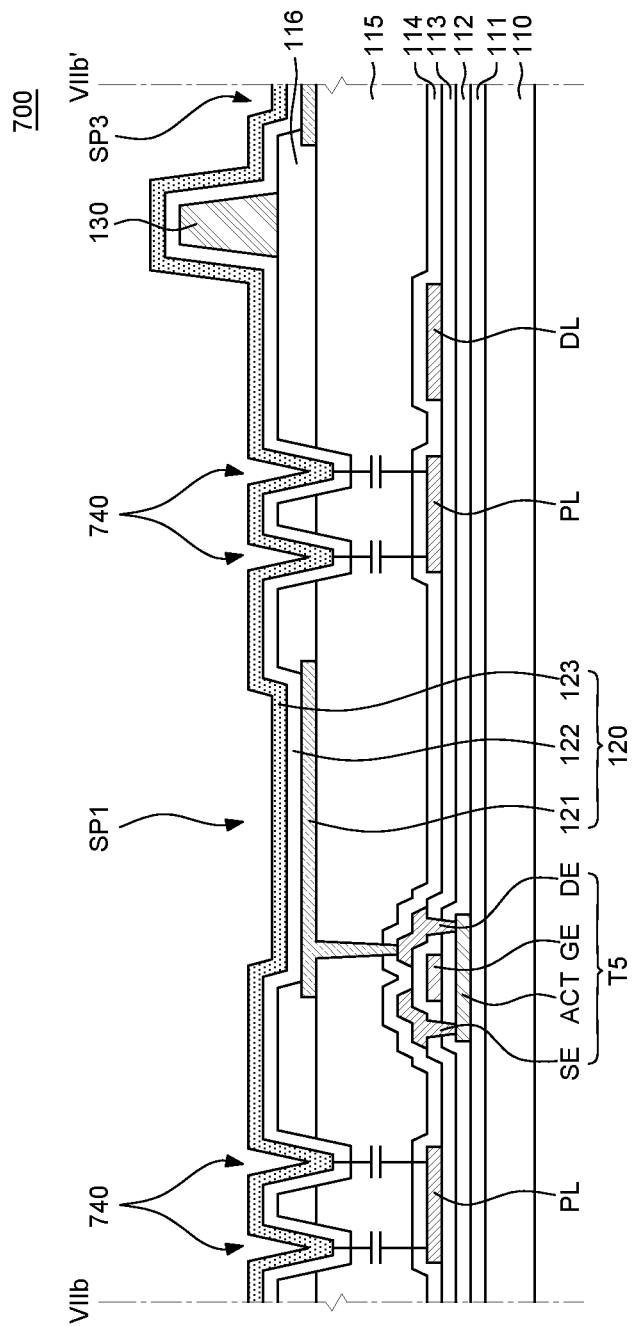
FIG. 7B is a cross-sectional view taken along VIIb-VIIb' of FIG. 7A according to one embodiment.

FIG. 6 is an enlarged plan view of a display apparatus according to still another exemplary embodiment of the present disclosure. FIG. 7A is an enlarged plan view of a display apparatus according to still another exemplary embodiment of the present disclosure. FIG. 7B is a cross-sectional view taken along VIIb-VIIb' of FIG. 7A according to one embodiment. As compared with the display apparatus 100 of FIGS. 1 to 3B, in a display apparatus 600 of FIG. 6 and a display apparatus 700 of FIGS. 7A and 7B, only first patterns 640 and 740 are different and the other configurations are substantially the same so that a redundant description will be omitted.

Referring to FIGS. 6 to 7B, a plurality of first patterns 640 and 740 is disposed between the plurality of sub pixels SP. One or more first patterns 640 and 740 may be disposed between a first sub pixel SP1 and a second sub pixel SP2, between the first sub pixel SP1 and a third sub pixel SP3, or between the second sub pixel SP2 and the third sub pixel SP3. At this time, the number of first patterns 640 and 740 disposed between the plurality of sub pixels SP may be designed in various ways in consideration of a turn-on voltage of the plurality of sub pixels SP.

For example, in the display apparatus 600 of FIG. 6, the plurality of first patterns 640 may be disposed between the first sub pixel SP1 and the second sub pixel SP2 and between the first sub pixel SP1 and the third sub pixel SP3. At this time, one of first parts 641 of the plurality of first patterns 640 between the first sub pixel SP1 and the third sub pixel SP3 may be disposed so as to overlap the high potential power line PL and the other first part 641 may be disposed in an area between the high potential power line PL and the first sub pixel SP1.

A first pattern 640 which overlaps the area between the high potential power line PL and the third sub pixel SP3, among the plurality of first patterns 640, may increase a length of a path through which the leakage current flows. Further, a first pattern 640 which overlaps the high potential power line PL, among the plurality of first patterns 640, increases the length of the path through which the leakage current flows and forms a capacitor with the high potential power line PL to trap carriers of the leakage current which flows to the adjacent sub pixel SP.

In the meantime, in FIG. 6, it is illustrated that two first parts 641 of the first pattern 640 are disposed only between the first sub pixel SP1 and the second sub pixel SP2 and between the first sub pixel SP1 and the third sub pixel SP3. However, one or more of second parts 642 of the first pattern 640 may also be disposed between the second sub pixel SP2 and the third sub pixel SP3 and the placement and the number of the plurality of first patterns 640 are not limited thereto.

Next, in the display apparatus 700 of FIGS. 7A and 7B, a plurality of first patterns 740 may be disposed between the plurality of sub pixels SP. Specifically, a first parts 741 of the plurality of first patterns 740 may be disposed to overlap one high potential power line PL disposed between the plurality of sub pixels SP. As the plurality of first patterns 740 overlaps one high potential power line PL, the number of capacitors formed by the cathode 123 and the high potential power line PL may be increased. Furthermore, a second parts 742 of the plurality of first patterns 740 may also be disposed between the second sub pixel SP2 and the third sub pixel SP3.

In the meantime, even though in FIGS. 7A and 7B, it is illustrated that the plurality of first patterns 740 overlaps one high potential power line PL, the plurality of first patterns 740 may also be disposed to overlap other DC lines such as the initialization signal line IL, and is not limited thereto.

In the display apparatuses 600 and 700 according to still another exemplary embodiments of the present disclosure, the plurality of first patterns 640 and 740 are disposed between the plurality of sub pixels SP to reduce the leakage current which is generated during the driving of the display apparatuses 600 and 700 to flows to a sub pixel SP which does not emit light. For example, in the display apparatus 600 of FIG. 6, the plurality of first patterns 640 is disposed between the plurality of sub pixels SP. Some of the plurality of first patterns 640 increases a length of the path through which the leakage current flows to reduce the leakage current which flows to the adjacent sub pixel SP. The others of the plurality of first patterns 640 overlap the DC line such as the high potential power line PL to form a capacitor formed by the cathode 123 and the DC line and the capacitor traps the carriers of the leakage current to reduce the leakage current which flows to the adjacent sub pixels SP. Further, in the display apparatus 700 of FIGS. 7A and 7B, the plurality of first patterns 740 may be disposed to overlap one DC line disposed between the plurality of sub pixels SP, for example, the high potential power line PL. As the plurality of first patterns 740 overlaps one high potential power line PL, the number of capacitors formed by the cathode 123 and the high potential power line PL may be increased, and more carriers of the leakage current may be trapped. Therefore, the plurality of first patterns 740 are disposed to overlap one DC line to reduce the leakage current which flows to the adjacent sub pixel SP. Accordingly, in the display apparatuses 600 and 700 according to still another exemplary embodiments of the present disclosure, the plurality of first patterns 640 and 740 is disposed between the plurality of sub pixels SP. Therefore, when one sub pixel SP is driven, the degradation of the display quality due to the color mixture, spot defect, or color abnormality caused by the leakage current flowing to the adjacent sub pixel SP may be reduced.

In the display apparatuses 600 and 700 according to still another exemplary embodiments of the present disclosure, the number of first patterns 640 and 740 disposed between the plurality of sub pixels SP may be designed to vary depending on the turn-on voltage of the plurality of sub pixels SP. For example, the leakage current may easily flow from the first sub pixel SP1 having the highest turn-on voltage to the third sub pixel SP3 having the lowest turn-on voltage so that in a situation in which only the first sub pixel SP1 needs to emit light, the third sub pixel SP3 may also emit light. Accordingly, the first patterns 640 and 740 may be disposed most between the first sub pixel SP1 having the highest turn-on voltage and the third sub pixel SP3 having the lowest turn-on voltage. Further, a number of the first patterns 640 and 740 disposed between the second sub pixel SP2 having a turn-on voltage lower than that of the first sub pixel SP1 and the third sub pixel SP3 having a lowest turn-on voltage is smaller than the number of first patterns 640 and 740 disposed between the first sub pixel SP1 and the third sub pixel SP3. Therefore, in the display apparatuses 600 and 700 according to still another exemplary embodiment of the present disclosure, the placement and the number of first patterns 640 and 740 may be designed in consideration of the turn-on voltage of the plurality of sub pixels SP.

Figure 8:
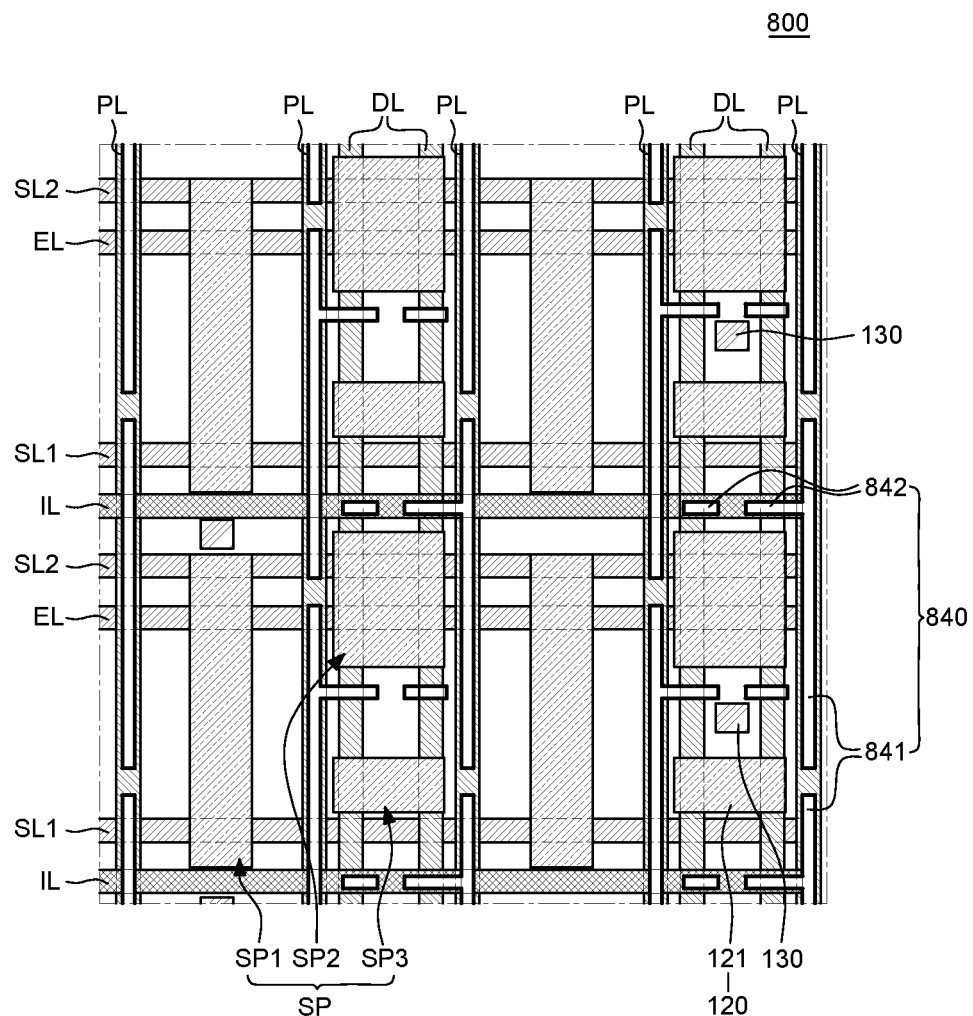
FIG. 8 is an enlarged plan view of a display apparatus according to still another exemplary embodiment of the present disclosure.

FIG. 8 is an enlarged plan view of a display apparatus according to still another exemplary embodiment of the present disclosure. As compared with the display apparatus 100 of FIGS. 1 to 3B, the only difference between a display apparatus 800 of FIG. 8 and the display apparatus 100 of FIGS. 1 to 3B is a plurality of first patterns 840, but the other configurations are substantially the same, so that a redundant description will be omitted.

Referring to FIG. 8, some of the plurality of first patterns 840 are disposed to be separated. First parts 841 among the plurality of first patterns 840 are disposed to be separated with a predetermined interval and second parts 842 of the plurality of first patterns 840 are also disposed to be separated with a predetermined interval.

For example, the first parts 841 of the first pattern 840 disposed at the left side of the second sub pixel SP2 and the third sub pixel SP3 may be partially open between the second sub pixel SP2 and the first sub pixel SP1. The first parts 841 of the first pattern 840 disposed at the right side of the second sub pixel SP2 and the third sub pixel SP3 may be partially open between the third sub pixel SP3 and the first sub pixel SP1. Further, the second part 842 of the first pattern 840 disposed between the second sub pixel SP2 and the third sub pixel SP3 is also partially open.

In the meantime, in FIG. 8, it is illustrated that the first pattern 840 is separated between the first sub pixel SP1 and the second sub pixel SP2, between the first sub pixel SP1 and the third sub pixel SP3, and between the second sub pixel SP2 and the third sub pixel SP3. However, the first pattern 840 may be separated in a location where the contact hole is disposed or in a location overlapping the scan lines SL1 or SL2 or the data line DL through which the AC signal flows. The location where the first pattern 840 is separated is not limited thereto.

In the display apparatus 800 according to still another exemplary embodiment of the present disclosure, the first pattern 840 disposed between the plurality of sub pixels SP is partially separated so that the increase of the resistance of the cathode 123 may be reduced. A part of the cathode 123 disposed in the plurality of first patterns 840 forms a capacitor with the DC line to reduce the flow of the leakage current. That is, the resistance may be increased in a part of the cathode 123 overlapping the plurality of first patterns 840. At this time, a part of the plurality of first patterns 840 is separated to lower the resistance of the cathode 123 so that the luminance deviation in accordance with the voltage drop may be reduced. For example, the first part 841 of the first pattern 840 between the first sub pixel SP1 and the second sub pixel SP2 is partially separated and a part between the first sub pixel SP1 and the third sub pixel SP3 is also separated. Further, the second part 842 between the second sub pixel SP2 and the third sub pixel SP3 is also partially separated. Accordingly, in the display apparatus 800 according to still another exemplary embodiment of the present disclosure, a part of the first pattern 840 is separated to reduce the voltage drop in the cathode 123 and reduce the luminance deviation.

Figure 9:
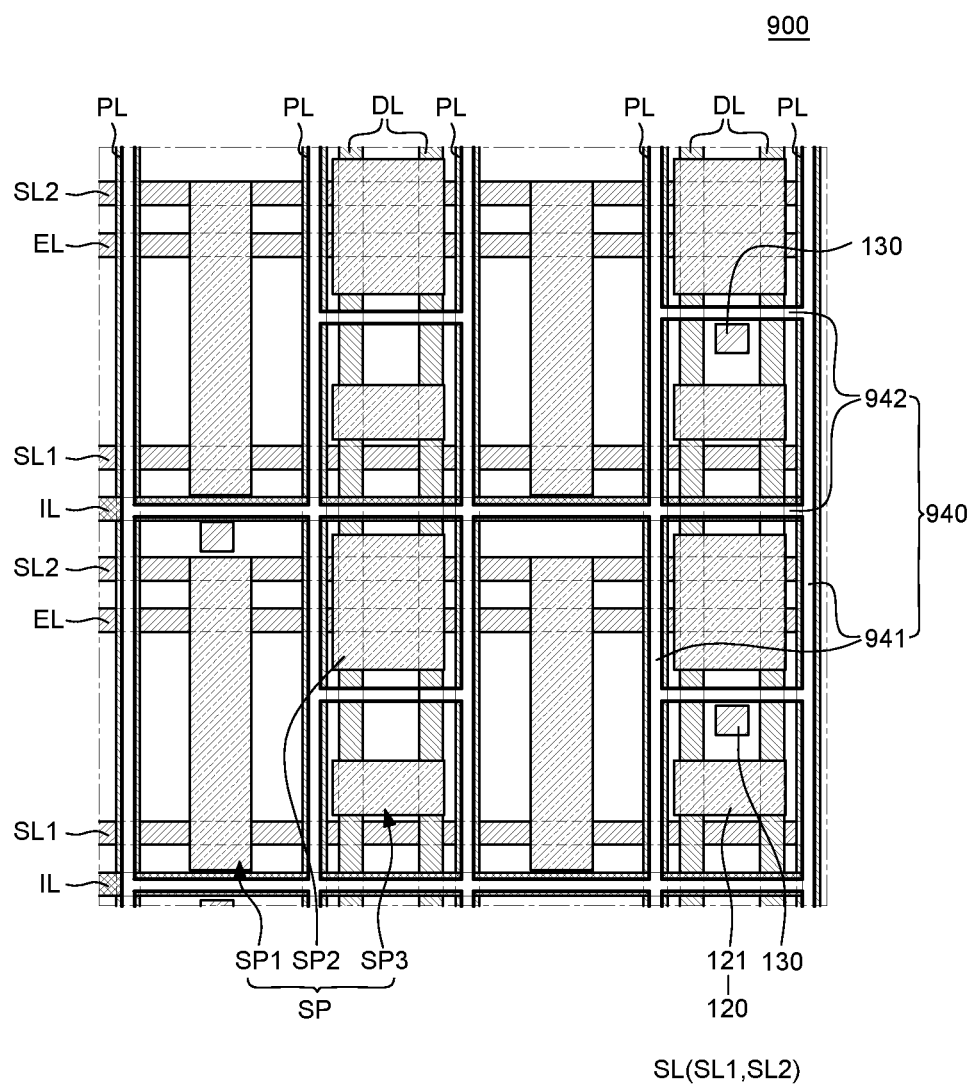
FIG. 9 is an enlarged plan view of a display apparatus according to still another exemplary embodiment of the present disclosure.

FIG. 9 is an enlarged plan view of a display apparatus according to still another exemplary embodiment of the present disclosure. As compared with the display apparatus 100 of FIGS. 1 to 3B, the only difference between a display apparatus 900 of FIG. 9 and the display apparatus 100 of FIGS. 1 to 3B is a plurality of first patterns 940, but the other configurations are substantially the same, so that a redundant description will be omitted.

Referring to FIG. 9, a plurality of first patterns 940 is disposed to enclose a plurality of sub pixels SP, respectively. The first pattern 940 may be disposed to enclose the perimeter (e.g., four sides) of the plurality of sub pixels SP in the plan view. For example, first parts 941 and second parts 942 of the first pattern 940 disposed around the sides of each of the plurality of sub pixels SP are connected to each other and the first pattern 940 may be formed with a closed curve which encloses a first sub pixel SP, a second sub pixel SP2, and a third sub pixel SP3.

The first pattern 940 is disposed to enclose the second sub pixel SP2 adjacent to the first sub pixel SP1 and the third sub pixel SP3, enclose the third sub pixel SP3 adjacent to the second sub pixel SP2 and the first sub pixel SP1, and enclose the first sub pixel SP1 adjacent to the second sub pixel SP2 and the third sub pixel SP3. The first pattern 940 may be disposed to enclose between the first sub pixel SP1 and the second sub pixel SP2, between the first sub pixel SP1 and the third sub pixel SP3, and between the second sub pixel SP2 and the third sub pixel SP3. Accordingly, the first pattern 940 may be disposed to form a mesh pattern.

In the meantime, even though in FIG. 9, it is illustrated that the first pattern 940 encloses all the plurality of sub pixels SP, the first pattern 940 may not be disposed between the plurality of first sub pixels SP1 disposed in the same column, and is not limited thereto. For example, the first pattern 940 is not disposed between the plurality of first sub pixels SP1 disposed on the same column, but may be disposed only between the first sub pixel SP1 and the second sub pixel SP2 and between the first sub pixel SP1 and the third sub pixel SP3. The turn-on voltage of the plurality of first sub pixels SP1 disposed in the same column is substantially the same, so that when one of first sub pixels SP1 is driven, emission problem due to the leakage current in the adjacent first sub pixel SP1 hardly occurs. However, there may be a problem in that the second sub pixel SP2 or the third sub pixel SP3 having a relatively low turn-on voltage emits light due to the leakage current in the first sub pixel SP1. Therefore, the first pattern 940 may be disposed between the plurality of sub pixels SP having different turn-on voltages, but may not be disposed between the sub pixels SP having a substantially same turn-on voltage.

In the display apparatus 900 according to still another exemplary embodiment of the present disclosure, the first pattern 940 is disposed to enclose sides of each of the plurality of sub pixels SP to improve the display quality by reducing color abnormality and spot defect due to the leakage current. The first pattern 940 is disposed to enclose each of the plurality of sub pixels SP so that the leakage current which flows between the plurality of sub pixels SP having different turn-on voltages may be reduced. In some of the first patterns 940 which overlaps the DC line, the cathode 123 and the DC line form a capacitor which traps carriers of the leakage current. In the other of the first pattern 940, the length of the path through which the leakage current moves is increased to increase a resistance so that the leakage current which flows to the adjacent sub pixel SP may be reduced. Accordingly, in the display apparatus 900 according to still another exemplary embodiment of the present disclosure, the first pattern 940 is disposed to enclose four sides of each of the plurality of sub pixels SP to reduce the degradation in the display quality due to the leakage current and reduce the power consumption.

Figure 10A:
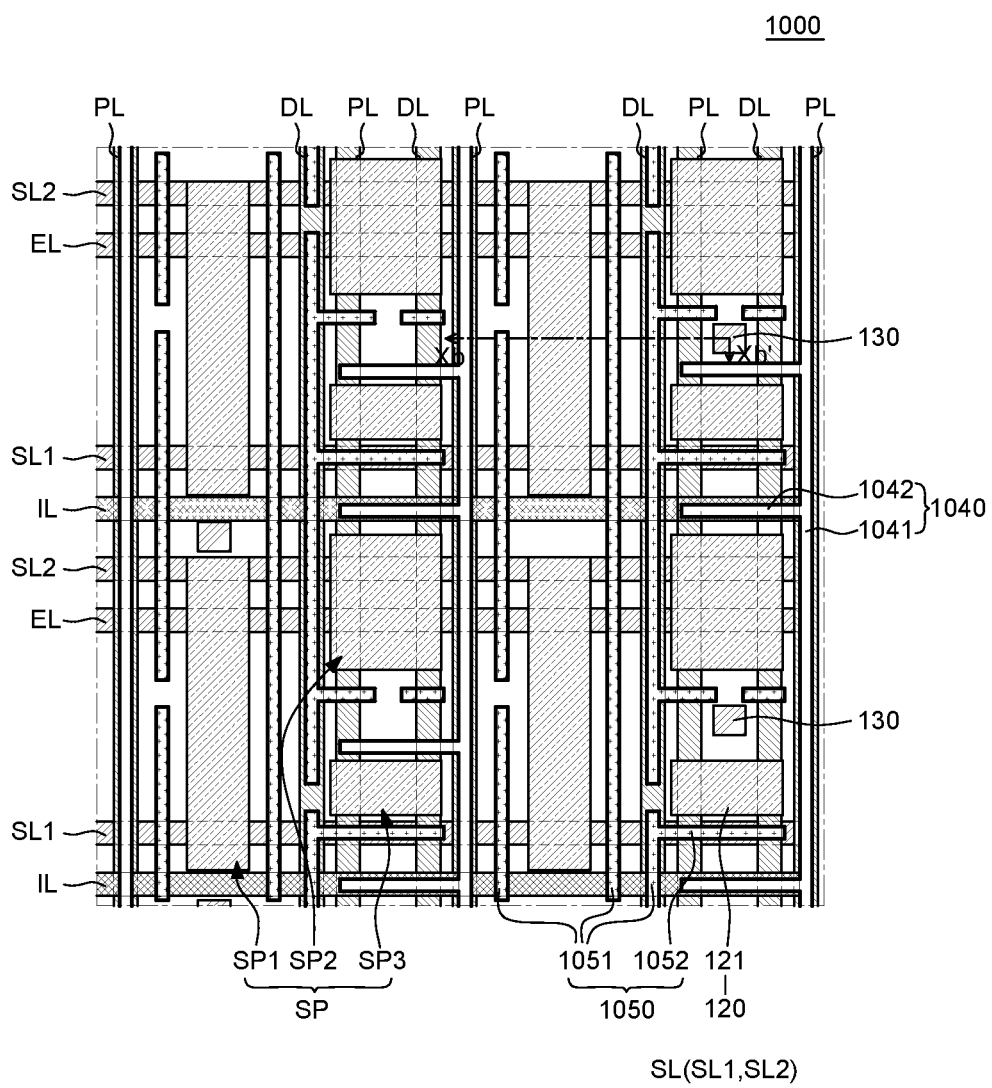
FIG. 10A is an enlarged plan view of a display apparatus according to still another exemplary embodiment of the present disclosure.
Figure 10B:
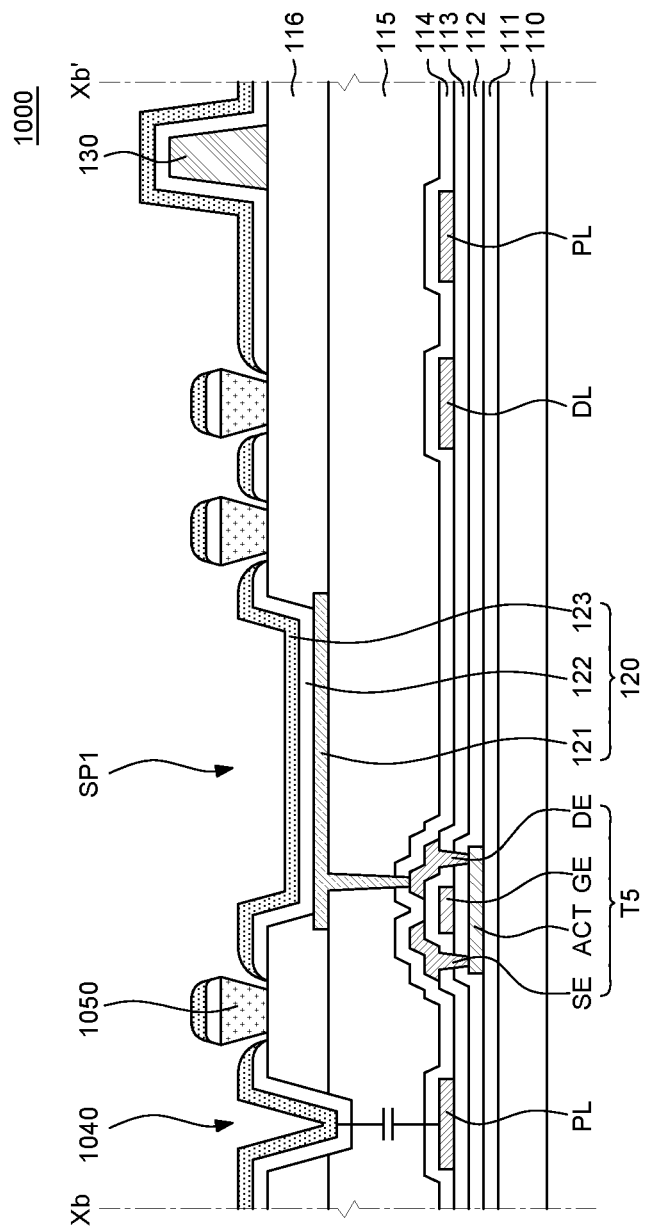
FIG. 10B is a cross-sectional view of a display apparatus taken along Xb-Xb' of FIG. 10A according to one embodiment.

FIG. 10A is an enlarged plan view of a display apparatus according to still another exemplary embodiment of the present disclosure. FIG. 10B is a cross-sectional view of a display apparatus taken along Xb-Xb' of FIG. 10A according to one embodiment. As compared with the display apparatus 100 of FIGS. 1 to 3B, a display apparatus 1000 of FIGS. 10A and 10B further includes a second pattern 1050, but other configurations are substantially the same, so that a redundant description will be omitted.

Referring to FIG. 10A, a plurality of second patterns 1050 is disposed between the plurality of sub pixels SP. The plurality of second patterns 1050 may be disposed to be spaced apart from a plurality of first patterns 1040. Further, at least a part of the plurality of second patterns 1050 may be disposed to overlap an AC line which transmits an AC signal.

The plurality of second patterns 1050 includes a third part 1051 and a fourth part 1052. The third part 1051 is a part extending in a column direction between the plurality of sub pixels SP. The third part 1051 may be a part extending in a column direction, between the first sub pixel SP1 and the second sub pixel SP2 and between the first sub pixel SP1 and the third sub pixel SP3. For example, the third part 1051 may be disposed to extend in a column direction, between the first sub pixel SP1 and the second sub pixel SP2 and between the first sub pixel SP1 and the third sub pixel SP3. Only one or more third parts 1051 of the second pattern 1050 may be disposed at one side of the second sub pixel SP2 and the third sub pixel SP3 and one or more first part 1041 of the first pattern 1040 may be disposed at the other side of the second sub pixel SP2 and the third sub pixel SP3. Further, only the third part 1051 is disposed at one side of the second sub pixel SP2 and the third sub pixel SP3 and the first part 1041 and the third part 1051 may be disposed together at the other side of the second sub pixel SP2 and the third sub pixel SP3.

The fourth part 1052 is a part extending in a row direction between the plurality of sub pixels SP. The fourth part 1052 may be a part extending in a row direction, between the second sub pixel SP2 and the third sub pixel SP3 or between the first sub pixels SP1. At this time, the fourth part 1052 may extend in the row direction from the third part 1051 or may be disposed to be separated from the third part 1051. For example, the fourth part 1052 may be disposed to extend in a row direction between the second sub pixel SP2 and the third sub pixel SP3. Further, the fourth part 1052 of the second pattern 1050 may be disposed between the second part 1042 of the first pattern 1040 between the second sub pixel SP2 and the third sub pixel SP3 and the third sub pixels SP3. For example, the fourth part 1052 extending from the third part 1051 at one side of the second sub pixel SP2 is disposed to be adjacent to the second sub pixel SP2 between the second sub pixel SP2 and the third sub pixel SP3. The second part 1042 extending from the first part 1041 at the other side of the second sub pixel SP2 is disposed between the fourth part 1052 and the third sub pixel SP3. Further, only any one of the second part 1042 of the first pattern 1040 and the fourth part 1052 of the second pattern 1050 may be disposed between the second sub pixel SP2 and the third sub pixel SP3. For example, only the fourth part 1052 is disposed above the second sub pixel SP2 and only the second part 1042 may be disposed below the second sub pixel SP2. However, if the plurality of second patterns 1050 and the plurality of first patterns 1040 are spaced apart from each other, the placement of the plurality of second patterns 1050 and the plurality of first patterns 1040 are not limited as illustrated in the drawings.

In the meantime, at least a part of the plurality of second patterns 1050 may be disposed to overlap an AC line among a plurality of wiring lines. For example, a least a part of the third part 1051 of the plurality of second patterns 1050 may overlap the data line DL which extends in the column direction among the AC lines. Further, at least a part of the fourth part 1052 of the plurality of second pattern 1050 may be disposed to overlap the scan line SL which is an AC line.

If the plurality of second patterns 1050 is disposed to overlap the DC line, the number of capacitors disposed between the cathodes 123 disposed in the plurality of first patterns 1040 and the DC line is reduced and the leakage current which flows to the adjacent sub pixel SP may be increased. Therefore, the plurality of second patterns 1050 may be disposed so as not to overlap the DC line.

Referring to FIG. 10B together, a second pattern 1050 is disposed on the bank 116 and an organic layer 122 and a cathode 123 of a light emitting diode 120 are disposed on the second pattern 1050. The plurality of second patterns 1050 may be disposed to be spaced apart from a plurality of first patterns 1040 and the spacer 130 on an upper surface of the bank 116.

In the plurality of second patterns 1050, a width in an upper portion may be larger than a width in a lower portion.

That is, the plurality of second patterns 1050 may be formed as a reverse spacer in which the width is narrowed from the upper portion to the lower portion. Further, at least one of a common layer and the cathode 123 formed on the plurality of second patterns 1050 may be disconnected by the second pattern 1050 which is a reverse spacer. When the organic layer 122 of the common layer and the cathode 123 are formed on the entire substrate 110, on the plurality of second patterns 1050 which is a reverse spacer, it may be difficult to deposit the organic layer 122 and the cathode 123 below the plurality of second patterns 1050 due to the shadow effect. Therefore, a lower portion of the plurality of second patterns 1050 is blocked by an upper portion of the plurality of second patterns 1050 having a relatively larger width so that it is difficult to deposit the organic layer 122 and the cathode 123 below the plurality of second patterns 1050. Therefore, at least one of the organic layer 122 and the cathode 123 may be disconnected in the plurality of second patterns 1050. Accordingly, at least a part of the common layer and the cathode 123 of the light emitting diode 120 may be electrically insulated in the plurality of second patterns 1050.

At this time, as the organic layer 122 is closer to the plurality of second patterns 1050, the resistance may be increased. Specifically, the organic layer 122 is formed with a non-uniform thickness in the plurality of second patterns 1050 which is a reverse spacer or is partially separated so that the resistance of the organic layer 122 may be increased. Specifically, it is difficult to sufficiently deposit the material which forms the organic layer 122 in the area adjacent to the lower portion of the plurality of second patterns 1050 due to the shadow effect so that the organic layer 122 may be formed to have a small thickness in an area adjacent to the lower portion of the plurality of second patterns 1050. As another example, it is difficult to deposit the organic layer 122 to the side surface of the second pattern 1050 due to the shadow effect and a part of the organic layer 122 may be separated. That is, it is difficult to continuously form the organic layer 122 with a uniform thickness in the plurality of second patterns 1050 so that the resistance of the organic layer 122 in the plurality of second patterns 1050 may be increased. Accordingly, as the organic layer 122 is closer to the plurality of second patterns 1050, the resistance may be increased.

In the meantime, a height of the plurality of second patterns 1050 may be lower than a height of the plurality of spacers 130. In a situation in which the plurality of second patterns 1050 and the plurality of spacers 130 are disposed together on an upper surface of the bank 116, when the height of the plurality of second patterns 1050 is higher than a height of the plurality of spacers 130, the deposition mask is in contact with the plurality of second patterns 1050. Therefore, it is difficult to bring the plurality of spacers 130 to be in contact with the deposition mask. Therefore, the distance between the deposition mask and the substrate 110 is different from that as designed and it may be difficult to form the light emitting diode 120. Accordingly, the height of the plurality of second patterns 1050 is formed to be lower than the height of the plurality of spacers 130 to constantly maintain the distance between the deposition mask and the substrate 110.

In the meantime, referring to FIG. 10A, the plurality of second patterns 1050 is disposed to be partially separated. The second patterns 1050 which enclose one sub pixel SP among the plurality of sub pixels SP may be disposed to be spaced apart from each other. The third parts 1051 of the second pattern 1050 may be disposed to be separated from each other with a predetermined interval and the fourth parts 1052 may also be disposed to be separated from each other with a predetermined interval. For example, the third parts 1051 of the second pattern 1050 disposed at the left side of the first sub pixel SP1, among the second patterns 1050 which enclose the first sub pixel SP1 may be disposed to be spaced apart from each other.

As described above, in the second pattern 1050 which is a reverse spacer, at least one of the organic layer 122 and the cathode 123 of the light emitting diode 120 may be disconnected. If the second pattern 1050 completely encloses the plurality of sub pixels SP, the organic layer 122 and/or the cathode 123 is separated by the second pattern 1050 so that it may be difficult for the plurality of light emitting diodes 120 to emit light. Therefore, the plurality of second patterns 1050 may be disposed to enclose the plurality of light emitting diodes and form an open curve in which a part enclosing each of the plurality of light emitting diodes 120 is open.

For example, the third parts 1051 of the second pattern 1050 disposed at both sides of the second sub pixel SP2 and the third sub pixel SP3 may be partially open between the first sub pixel SP1 and the second sub pixel SP2 or between the first sub pixel SP1 and the third sub pixel SP3. Further, the fourth part 1052 of the second pattern 1050 disposed between the second sub pixel SP2 and the third sub pixel SP3 is also partially open. However, the part where the second pattern 1050 is open may be designed in various ways other than that illustrated in the drawing, and is not limited thereto.

In the display apparatus 1000 according to still another exemplary embodiments of the present disclosure, a first pattern 1040 which is a trench and a second pattern 1050 which is a reverse spacer are disposed together between the plurality of sub pixels SP to reduce the transmission of the leakage current to the adjacent sub pixel SP. The first pattern 1040 which is a trench is disposed in the bank 116 between the plurality of sub pixels SP to increase the length of the common layer which is a path through which the leakage current flows so that the leakage current which flows to the adjacent sub pixel SP may be reduced. Further, the carriers of the leakage current are trapped by the capacitor formed between the cathode 123 and the DC line in the first pattern 1040 to reduce the leakage current which flows to the adjacent sub pixel SP. Furthermore, the second pattern 1050 which is a reverse spacer is disposed on the bank 116 between the plurality of sub pixels SP to disconnect at least one of the common layer and the cathode 123 so that the leakage current which flows may be reduced. Specifically, when the common layer of organic layer 122 which is a path through which the leakage current flows in the second pattern 1050 is disconnected, the path through which the leakage current flows to the adjacent sub pixel SP may be blocked. Further, even though the common layer of organic layer 122 is connected in the second pattern 1050, the common layer may not be deposited to have a uniform thickness so that the resistance may be increased and the flowing of the leakage current may be reduced. Accordingly, in the display apparatus 1000 according to still another exemplary embodiment of the present disclosure, the plurality of second patterns 1050 is disposed together with the plurality of first patterns 1040. Therefore, the problem in that when one sub pixel SP is driven, the leakage current flows to the adjacent sub pixel SP so that the spot defect is visibly recognized due to the color mixture and the color reproduction rate is degraded may be reduced.

Figure 11:
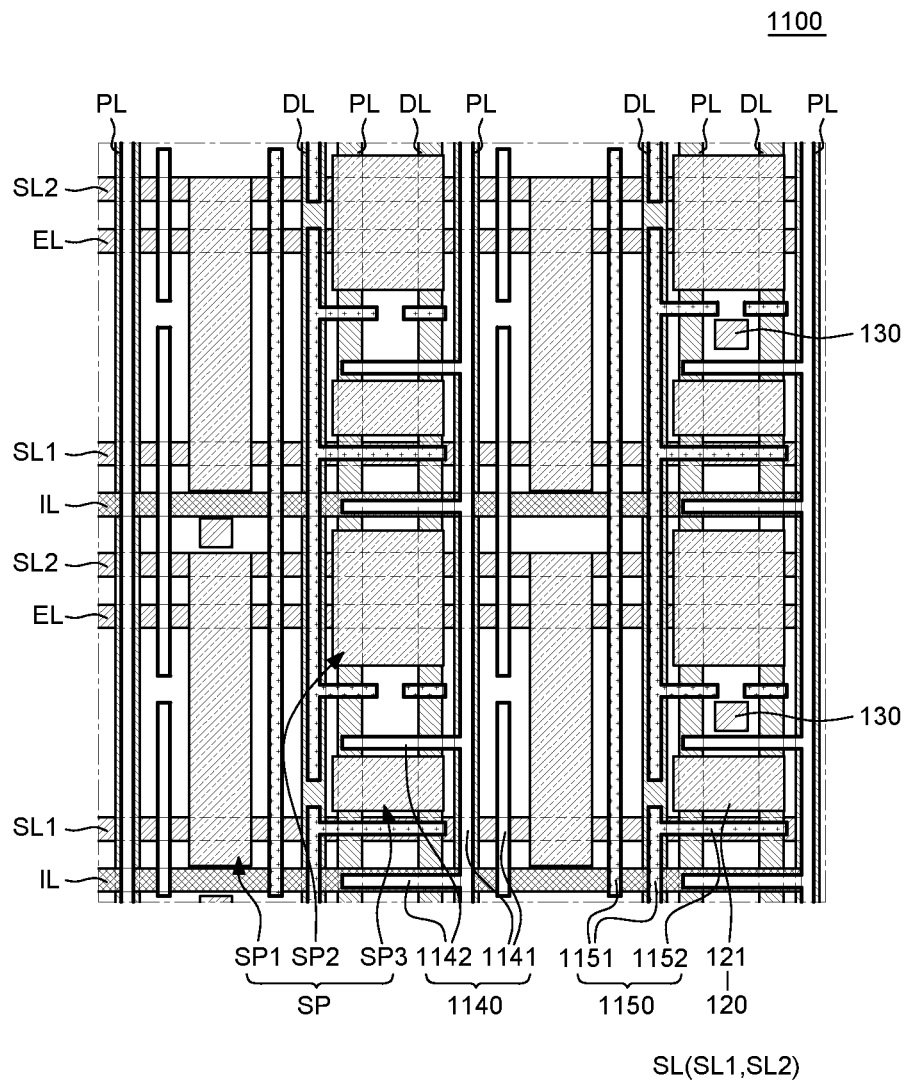
FIG. 11 is an enlarged plan view of a display apparatus according to still another exemplary embodiment of the present disclosure.
Figure 12:
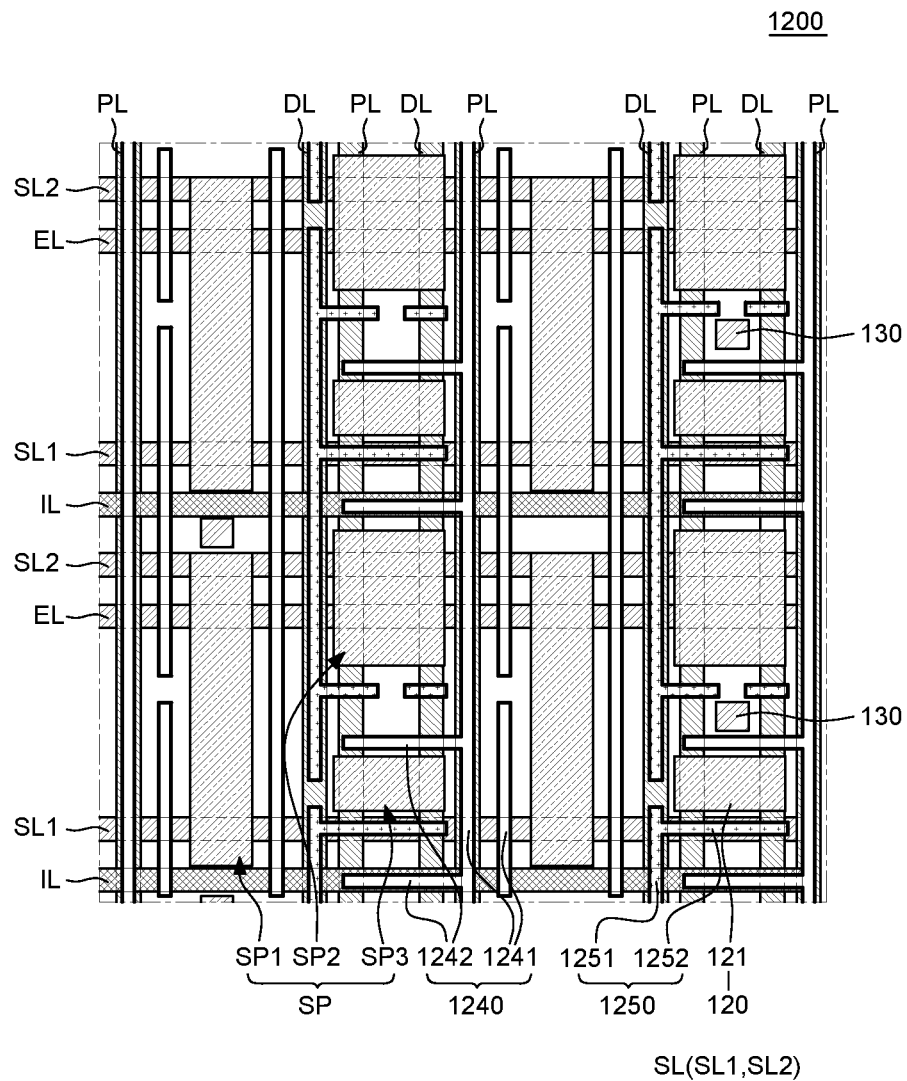
FIG. 12 is an enlarged plan view of a display apparatus according to still another exemplary embodiment of the present disclosure.

FIG. 11 is an enlarged plan view of a display apparatus according to still another exemplary embodiment of the present disclosure. FIG. 12 is an enlarged plan view of a display apparatus according to still another exemplary embodiment of the present disclosure. As compared with the display apparatus 1000 of FIGS. 10A and 10B, in a display apparatus 1100 of FIG. 11 and a display apparatus 1200 of FIG. 12, only a plurality of first patterns 1140 and 1240 and a plurality of second patterns 1150 and 1250 are different and the other configurations are substantially the same so that a redundant description will be omitted.

Referring to FIG. 11, in the display apparatus 1100 of FIG. 11, only the plurality of first patterns 1140 or only the plurality of second patterns 1150 may be disposed between the first sub pixel SP1 and the second sub pixel SP2 and between the first sub pixel SP1 and the third sub pixel SP3. For example, only a first part 1141 of the plurality of first patterns 1140 is disposed at one side of the first sub pixel SP1 and only a third part 1151 of the plurality of second patterns 1150 is disposed at the other side of the first sub pixel SP1. At this time, only some of the plurality of first patterns 1140 disposed between the first sub pixel SP1 and the second sub pixel SP2 may be separated and the other first patterns 1140 may not be separated. Similarly, only some of the plurality of second patterns 1150 disposed between the first sub pixel SP1 and the second sub pixel SP2 may be separated and the other second patterns 1150 may not be separated to continuously extend.

Referring to FIG. 12, in the display apparatus 1200 of FIG. 12, only the plurality of first patterns 1240 or both the first pattern 1240 and the second pattern 1250 may be disposed between the first sub pixel SP1 and the second sub pixel SP2 and between the first sub pixel SP1 and the third sub pixel SP3. For example, only the plurality of first patterns 1240 which is partially separated is disposed at one side of the first sub pixel SP1 and the first pattern 1240 which is continuously extended and the second pattern 1250 which is partially separated may be disposed together at the other side of the first sub pixel SP1.

Further, referring to FIGS. 11 and 12 together, in both the display apparatuses 1100 and 1200 of FIGS. 11 and 12, the first patterns 1140 and 1240 and the second patterns 1150 and 1250 are disposed together between the second sub pixel SP2 and the third sub pixel SP3. For example, fourth parts 1152 and 1252 extending from the third parts 1151 and 1251 at one side of the second sub pixel SP2 between the second sub pixel SP2 and the third sub pixel SP3 are disposed to be adjacent to the second sub pixel SP2. Further, the second part 1142 and 1242 extending from the first part 1141 and 1241 at the other side of the second sub pixel SP2 is disposed to be adjacent to the third sub pixel SP3. At this time, only the second patterns 1150 and 1250 disposed between the second sub pixel SP2 and the third sub pixel SP3 may be disposed to be separated.

In the display apparatuses 1100 and 1200 according to still another exemplary embodiments of the present disclosure, the plurality of first patterns 1140 and 1240 and the plurality of second patterns 1150 and 1250 are disposed between the plurality of sub pixels SP with various patterns to reduce the leakage current generated during the driving of the display apparatuses which flows to the adjacent sub pixel SP. For example, in the display apparatus 1100 of FIG. 11, only the plurality of first patterns 1140 are disposed at one side of the first sub pixel SP1 and only the plurality of second patterns 1150 are disposed at the other side of the first sub pixel SP1. Further, the first pattern 1140 and the second pattern 1150 may be disposed together between the second sub pixel SP2 and the third sub pixel SP3. In the display apparatus 1200 of FIG. 12, the plurality of first patterns 1240 are disposed at one side of the first sub pixel SP1 and the first pattern 1240 and the second pattern 1250 are disposed together at the other side of the first sub pixel SP1. Further, the first pattern 1240 and the second pattern 1250 may be disposed together between the second sub pixel SP2 and the third sub pixel SP3. In the display apparatuses 1100 and 1200 of FIGS. 11 and 12, the plurality of first patterns 1140 and 1240 is disposed between the plurality of sub pixels SP to increase the length of the path through which the leakage current flows. Further, the carriers of the leakage current are trapped so that the transmission of the leakage current to the sub pixel SP which does not emit light may be reduced. Further, in the display apparatuses 1100 and 1200 of FIGS. 11 and 12, the plurality of second patterns 1150 and 1250 is disposed between the plurality of sub pixels SP to disconnect at least a part of the common layer of the light emitting diode 120 which is a path through which the leakage current flows or increase the resistance by reducing a thickness. By doing this, the flowing of the leakage current may be reduced. Accordingly, in the display apparatuses 1100 and 1200 according to still another exemplary embodiments of the present disclosure, the plurality of first patterns 1140 and 1240 and the plurality of second patterns 1150 and 1250 are disposed between the plurality of sub pixels SP with various patterns. Therefore, it is possible to reduce the leakage current which is transmitted to the adjacent sub pixel SP and improve a display quality.

Figure 13:
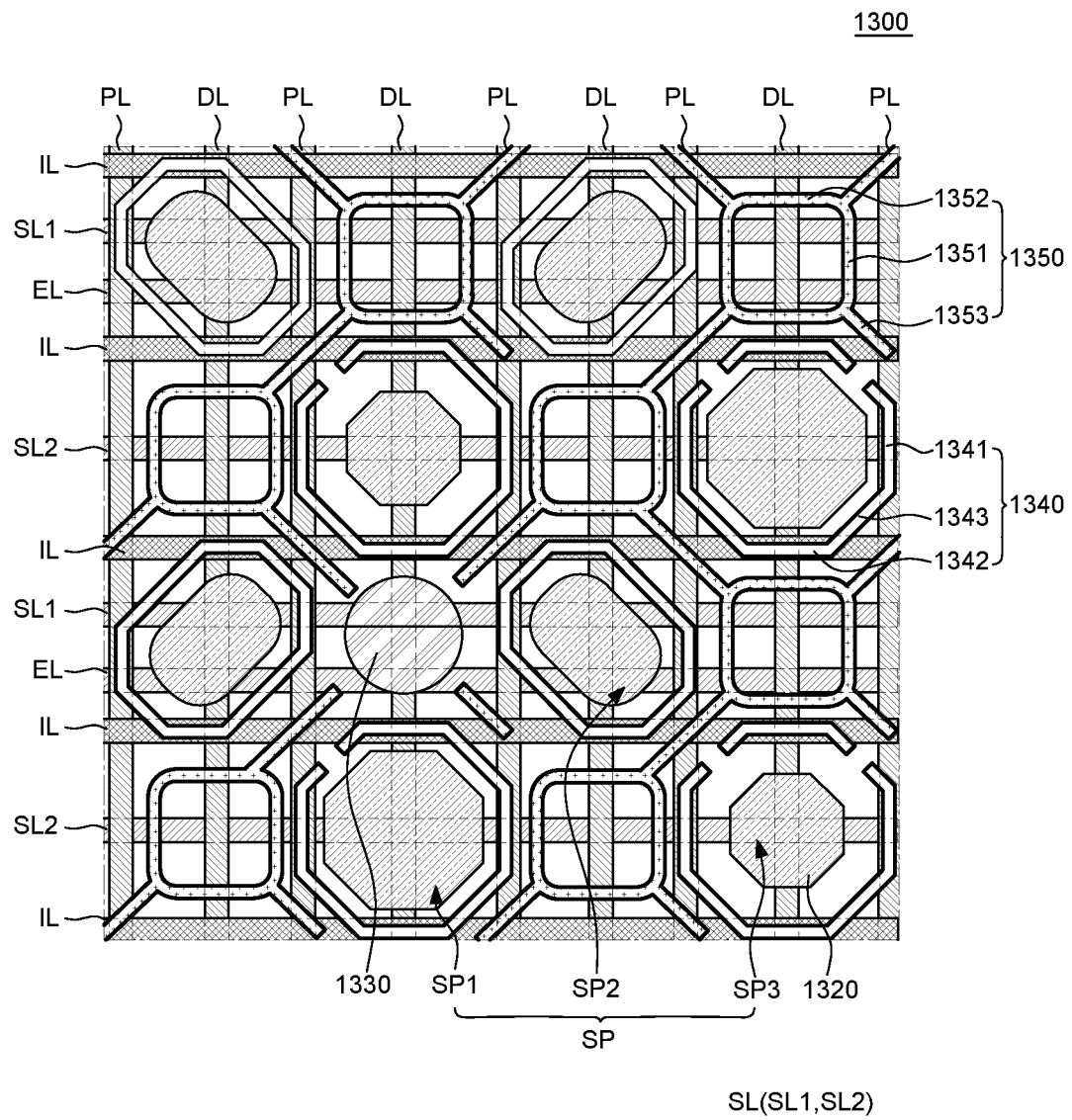
FIG. 13 is an enlarged plan view of a display apparatus according to still another exemplary embodiment of the present disclosure.

FIG. 13 is an enlarged plan view of a display apparatus according to still another exemplary embodiment of the present disclosure. As compared with the display apparatus 1000 of FIGS. 10A and 10B, the only difference between a display apparatus 1300 of FIG. 13 and the display apparatus 1000 of FIGS. 10A and 10B is a plurality of sub pixels SP, a plurality of wiring lines, a plurality of first patterns 1340 and a plurality of second patterns 1350, but the other configurations are substantially the same, so that a redundant description will be omitted.

Referring to FIG. 13, the plurality of sub pixels SP includes a first sub pixel SP1, a second sub pixel SP2, and a third sub pixel SP3.

The plurality of first sub pixels SP1 and the plurality of third sub pixels SP3 may be alternately disposed on the same column or the same row. For example, the first sub pixels SP1 and the third sub pixels SP3 may be alternately disposed on the same column and the first sub pixels SP1 and the third sub pixels SP3 may be alternately disposed on the same row.

The plurality of second sub pixels SP2 may be disposed on different columns and different rows from those of the plurality of first sub pixels SP1 and the plurality of third sub pixels SP3. For example, the plurality of second sub pixels SP2 is disposed on one row and the plurality of first sub pixels SP1 and the plurality of third sub pixels SP3 may be alternately disposed on a row adjacent to one row. The plurality of second sub pixels SP2 is disposed on one column and the plurality of first sub pixels SP1 and the plurality of third sub pixels SP3 may be alternately disposed on a column adjacent to one column. The plurality of first sub pixels SP1 and the second sub pixels SP2 may be opposite to each other in a diagonal direction and the plurality of third sub pixels SP3 and the second sub pixels SP2 may also be opposite to each other in a diagonal direction. Accordingly, the plurality of sub pixels SP may be disposed in a lattice form.

However, in FIG. 13, it is illustrated that the plurality of first sub pixels SP1 and the plurality of third sub pixels SP3 are disposed on the same column and the same row and the plurality of second sub pixels SP2 is disposed on different columns and different rows from those of the plurality of first sub pixels SP1 and the plurality of third sub pixels SP3. However, the placement of the plurality of sub pixels SP is not limited thereto.

The high potential power line PL extending in a column direction is disposed between the plurality of sub pixels SP. The high potential power line PL may be disposed between a column on which the plurality of second sub pixels SP2 is disposed and a column on which the plurality of first sub pixels SP1 and the plurality of third sub pixels SP3 are disposed. For example, the high potential power line PL may be disposed at both sides of the plurality of second sub pixels SP2 and at both sides of the plurality of first sub pixels SP1 and the plurality of third sub pixels SP3.

The plurality of data lines DL which extends in the column direction is disposed between the plurality of high potential power lines PL. That is, the plurality of high potential power lines PL and the plurality of data lines DL may be alternately disposed. Some of the plurality of data lines DL is disposed to overlap the plurality of second sub pixels SP2 disposed on the same column and the others of the plurality of data lines DL may be disposed to overlap the plurality of first sub pixels SP1 and the plurality of third sub pixels SP3 disposed on the same column.

A plurality of initialization signal lines IL extending in a row direction is disposed between the plurality of sub pixels SP. The initialization signal lines IL may be disposed between a row on which the plurality of second sub pixels SP2 is disposed and a row on which the plurality of first sub pixels SP1 and the plurality of third sub pixels SP3 are disposed. For example, the initialization signal lines IL may be disposed at both sides of the plurality of second sub pixels SP2 and at both sides of the plurality of first sub pixels SP1 and the plurality of third sub pixels SP3.

A plurality of scan lines SL and a plurality of emission control signal lines EL extending in a row direction are disposed between the plurality of initialization signal lines IL. For example, a first scan line SL1 of the plurality of scan lines SL is disposed to overlap the plurality of second sub pixels SP2 and a second scan line SL2 of the plurality of scan lines SL is disposed to overlap the plurality of first sub pixels SP1 and the plurality of third sub pixels SP3. Further, the plurality of emission control signal lines EL may be disposed to be adjacent to the first scan line SL1 to be disposed to overlap the second sub pixels SP2. Even though in FIG. 13, it is illustrated that some of the plurality of wiring lines is disposed between the plurality of sub pixels SP and the others overlap the plurality of sub pixels SP, the placement of the plurality of wiring lines is not limited thereto.

The plurality of first patterns 1340 is disposed between the plurality of sub pixels SP. The plurality of first pattern 1340 may be disposed to correspond to a planar shape of each of the plurality of sub pixels SP in the plan view. The plurality of first patterns 1340 may be disposed to enclose each of the plurality of sub pixels SP.

The plurality of first patterns 1340 includes a first part 1341, a second part 1342, and a first diagonal part 1343. The first part is a part extending in a column direction, the second part 1342 is a part extending in a row direction, and the first diagonal part 1343 is a part extending in a diagonal direction. Further, the first part 1341, the second part 1342, and the first diagonal part 1343 are connected to each other to enclose the plurality of sub pixels SP.

For example, the first part 1341 of the first pattern 1340 which encloses the first sub pixel SP1, among the plurality of first patterns 1340, overlaps the high potential power lines PL at a left side and a right side of the first sub pixel SP1. The second part 1342 overlaps the initialization signal line IL at an upper side and a lower side of the first sub pixel SP1. The first diagonal part 1343 may connect the first part 1341 and the second part 1342. At this time, a part of the first diagonal part 1343 is separated to lower the resistance of the cathode 123 and reduce the luminance deviation of the light emitting diode 1320 in accordance with the voltage drop phenomenon.

Further, the first part 1341 of the first pattern 1340 which encloses the second sub pixel SP2, among the plurality of first patterns 1340, overlaps the high potential power lines PL at a left side and a right side of the second sub pixel SP2. The second part 1342 overlaps the initialization signal line IL at an upper side and a lower side of the second sub pixel SP2, and the first diagonal part 1343 may connect the first part 1341 and the second part 1342. Further, the first part 1341 of the first pattern 1340 which encloses the third sub pixel SP3, among the plurality of first patterns 1340, overlaps the high potential power lines PL at a left side and a right side of the third sub pixel SP3. The second part 1342 overlaps the initialization signal line IL at an upper side and a lower side of the third sub pixel SP3, and the first diagonal part 1343 may connect the first part 1341 and the second part 1342. Further, a part of the first diagonal part 1343 enclosing the second sub pixel SP2 and the first diagonal part 1343 enclosing the third sub pixel SP3 is separated to lower the resistance of the cathode 123 and reduce the luminance deviation in accordance with the voltage drop phenomenon.

The plurality of second patterns 1350 is disposed between the plurality of sub pixels SP. The plurality of second patterns 1350 may be disposed to be spaced apart from the plurality of first patterns 1340. The plurality of second patterns 1350 may be disposed to form a closed curve in a space between the plurality of second sub pixels SP2 and between the plurality of first sub pixels SP1 and the plurality of third sub pixels SP3.

The plurality of second patterns 1350 includes a third part 1351, a fourth part 1352, and a second diagonal part 1353. The third part 1351 is a part extending in a column direction, the fourth part 1352 is a part extending in a row direction, and the second diagonal part 1353 is a part extending in a diagonal direction. Further, the third part 1351, the fourth part 1352, and the second diagonal part 1353 may be disposed to be connected to each other.

For example, in a space between the second sub pixels SP2 in the plurality of second patterns 1350, the third parts 1351 of the second pattern 1350 are disposed to be spaced apart from each other and the fourth parts 1352 may be disposed to connect an upper end and a lower end of the third parts 1351 which are spaced apart from each other. That is, the third part 1351 and the fourth part 1352 may form one rectangular shape. Accordingly, a part of the second pattern 1350 having a closed curve formed by the third part 1351 and the fourth part 1352 may be disposed in the space between the second sub pixels SP2.

Further, in the connection location of the third part 1351 and the fourth part 1352, the second diagonal part 1353 may be disposed to extend toward the second pattern 1350 disposed in a different row or a different column. For example, the second pattern 1350 formed by the third part 1351 and the fourth part 1352 is disposed on one row and the second diagonal part 1353 may extend toward the third part 1351 and the fourth part 1352 disposed in a row adjacent to one row at four connection locations of the third part 1351 and the fourth part 1352.

At this time, the second diagonal part 1353 may connect the third part 1351 and the fourth part 1352 disposed in different rows or columns, or extend between the third part 1351 and the fourth part 1352 disposed in different rows or columns, but may not connect the third part 1351 and the fourth part 1352 disposed in different rows or columns. For example, the third part 1351 and the fourth part 1352 disposed at the upper side of one first sub pixel SP1 and the third part 1351 and the fourth part 1352 disposed at the left side of one first sub pixel SP1 may be connected by the second diagonal part 1353. Further, the second diagonal part 1353 is disposed between the third part 1351 and the fourth part 1352 disposed at the upper side of one third sub pixel SP3 and the third part 1351 and the fourth part 1352 disposed at the right side of one third sub pixel SP3. The second diagonal part 1353 is connected to the third part 1351 and the fourth part 1352 disposed at the upper side of one third sub pixel SP3 and is spaced apart from the third part 1351 and the fourth part 1352 disposed at the right side of one third sub pixel SP3. Therefore, a part of the second diagonal part 1353 of the second pattern 1350 may be separated to lower the resistance of the cathode 123 and reduce the luminance deviation in accordance with the voltage drop phenomenon.

In the meantime, the spacer 1330 is disposed in a space between the second sub pixels SP2 and a space between the first sub pixel SP1 and the third sub pixel SP3. In this case, the second pattern 1350 having a closed curve shape which is formed by the third part 1351 and the fourth part 1352 may not be disposed in the part where the spacer 1330 is disposed. In other words, the plurality of first patterns 1340 and the plurality of second patterns 1350 may be disposed to be spaced apart from the spacer 1330.

In the display apparatus 1300 according to still another exemplary embodiment of the present disclosure, the plurality of first patterns 1340 and the plurality of second patterns 1350 are disposed between the plurality of sub pixels SP which is disposed in a lattice form to reduce flowing of the leakage current. The first sub pixel SP1 and the third sub pixel SP3 of the plurality of sub pixels SP may be alternately disposed on the same row and the same column. Further, the plurality of second sub pixels SP2 may be disposed on different rows and different columns from that of the first sub pixel SP1 and the third sub pixel SP3. Therefore, the plurality of first sub pixels SP1, the plurality of second sub pixels SP2, and the plurality of third sub pixels SP3 may be disposed to form a lattice form. At this time, the plurality of first patterns 1340 is disposed to enclose the first sub pixel SP1, the second sub pixel SP2, and the third sub pixel SP3, and the plurality of second patterns 1350 is disposed in an empty space enclosed by the first sub pixel SP1, the second sub pixel SP2, and the third sub pixel SP3. Therefore, when the display apparatus 1300 is driven, the leakage current which is transmitted to an unintended sub pixel SP may be reduced. The plurality of first patterns 1340 increases the length of the common layer which is a path through which the leakage current flows to reduce transmission of the leakage current, and the plurality of second patterns 1350 disconnects at least a part of the common layer to block the path through which the leakage current flows. Accordingly, in the display apparatus 1300 according to still another exemplary embodiment of the present disclosure, the plurality of first patterns 1340 and the plurality of second patterns 1350 are disposed between the plurality of sub pixels SP which is disposed in a lattice form. Therefore, it is possible to reduce the leakage current which flows to the adjacent sub pixel SP and minimize the degradation of the display quality due to the visible recognition of the color abnormality or spot defect.

The exemplary embodiments of the present disclosure can also be described as follows:

According to an aspect of the present disclosure, there is provided a display apparatus. The display apparatus includes a substrate in which a plurality of sub pixels is defined, a plurality of light emitting diodes which is disposed in the plurality of sub pixels and shares an organic layer and a cathode, a bank which is disposed below the cathode between the plurality of light emitting diodes, a plurality of wiring lines disposed between the bank and the substrate, and a first pattern which is disposed in the bank and overlaps at least one of the plurality of wiring lines. The cathode is disposed in the first pattern.

The display apparatus may further include at least one insulating layer disposed between the plurality of wiring lines and the cathode of the first pattern. The cathode of the first pattern may overlap any one wiring line among the plurality of wiring lines to form a capacitor.

The any one wiring line which forms the capacitor together with the cathode may be a DC line to which a DC signal is transmitted.

The display apparatus may further include a second pattern disposed on the bank to be spaced apart from the first pattern.

The organic layer may include a light emitting layer and a common layer disposed in the plurality of sub pixels and a resistance of the organic layer may be increased as it approaches the second pattern.

At least any one of the light emitting layer and the common layer may be disconnected by the second pattern.

The plurality of wiring lines may further include an AC line to which an AC signal is transmitted and at least a part of the second pattern overlaps the AC line.

The first pattern and the second pattern may be disposed together between the adjacent sub pixels among the plurality of sub pixels.

A plurality of first patterns may be disposed between the adjacent sub pixels among the plurality of sub pixels.

A plurality of second patterns may be disposed between the adjacent sub pixels among the plurality of sub pixels.

The first pattern may be disposed at one side of one sub pixel among the plurality of sub pixels and the second pattern may be disposed at the other side of one sub pixel.

The first pattern may include a first part extending in a column direction between the plurality of sub pixels, and a second part extending in a row direction between the plurality of sub pixels. The second pattern may include a third part extending in a column direction between the plurality of sub pixels, and a fourth part extending in a row direction between the plurality of sub pixels.

The first pattern may further include a first diagonal part extending in a direction different from those of the first part and the second part and the second pattern may further include a second diagonal part extending in a direction different from those of the third part and the fourth part.

The first pattern may be a trench extending toward the plurality of wiring lines from the bank and the second pattern may be a reverse spacer disposed on the bank.

The second patterns which enclose one sub pixel among the plurality of sub pixels may be disposed to be spaced apart from each other.

The plurality of wiring lines may further include a dummy line which is electrically connected to a wiring line overlapping the first pattern and the dummy line may be a wiring line disposed at the uppermost side among the plurality of wiring lines.

The plurality of sub pixels may include a first sub pixel, a second sub pixel, and a third sub pixel which emit different color light and the first sub pixel, the second sub pixel, and the third sub pixel may have different turn-on voltages.

The number of first patterns disposed between the first sub pixel and the third sub pixel may be different from the number of first patterns disposed between the second sub pixel and the third sub pixel.

The display apparatus may further include a second pattern disposed on the bank between the plurality of sub pixels. The number of second patterns disposed between the first sub pixel and the third sub pixel may be different from the number of second patterns disposed between the second sub pixel and the third sub pixel.

The first sub pixel may be a blue sub pixel, the second sub pixel may be a green sub pixel, and the third sub pixel may be a red sub pixel.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display apparatus, comprising:
    a substrate in which a plurality of sub pixels are defined;
    a plurality of light emitting diodes which are disposed in the plurality of sub pixels, the plurality of light emitting diodes having an organic layer that includes an organic light emitting layer that is shared between the plurality of light emitting diodes and a cathode electrode shared between the plurality of light emitting diodes;
    a bank disposed below the cathode electrode and between pairs of light emitting diodes from the plurality of light emitting diodes;
    a plurality of wiring lines disposed between the bank and the substrate;
    a first pattern through a thickness of the bank, the first pattern overlapping a first wiring line from the plurality of wiring lines; and
    a second pattern disposed on the bank, the second pattern spaced apart from the first pattern,
    wherein a first portion of the cathode electrode is disposed outside of the first pattern and a second portion of the cathode electrode is disposed in the first pattern,
    wherein the first wiring line overlapped by the second portion of the cathode electrode transmits a direct current (DC) signal, and
    wherein the plurality of wiring lines further includes a second wiring line that overlaps at least a part of the second pattern, wherein the second wiring line transmits an alternating current (AC) signal.

2. The display apparatus according to claim 1, further comprising:
    at least one insulating layer disposed between the plurality of wiring lines and the second portion of the cathode electrode that is disposed in the first pattern,
    wherein the second portion of the cathode electrode that is disposed in the first pattern overlaps the first wiring line, a capacitor formed between the second portion of the cathode electrode and the first wiring line.

3. The display apparatus according to claim 1, wherein the organic layer includes a plurality of different light emitting layers that each emit different colors of light and a common layer disposed in the plurality of sub pixels, wherein the common layer is shared between the plurality of sub pixels,
    wherein a first resistance of a first portion of the organic layer is that is closer to the second pattern is greater than a second resistance of a second portion of the organic layer that is farther from the second pattern than the first portion.

4. The display apparatus according to claim 3, wherein at least a portion of one of the organic light emitting layer or the common layer is disconnected from another portion of one of the organic light emitting layer or another portion of the common layer by the second pattern.

5. The display apparatus according to claim 1, wherein the first pattern and the second pattern are between adjacent sub pixels among the plurality of sub pixels.

6. The display apparatus according to claim 1, wherein a plurality of first patterns are disposed between adjacent sub pixels among the plurality of sub pixels.

7. The display apparatus according to claim 1, wherein a plurality of second patterns are disposed between adjacent sub pixels among the plurality of sub pixels.

8. The display apparatus according to claim 1, wherein the first pattern is disposed at a first side of a first sub pixel among the plurality of sub pixels and the second pattern is disposed at a second side of the first sub pixel.

9. The display apparatus according to claim 1, wherein the first pattern includes:
    a first part extending in a first direction between the plurality of sub pixels; and
    a second part extending in a second direction between the plurality of sub pixels, the second direction different from the first direction; and
    wherein the second pattern includes:
        a third part extending in the first direction between the plurality of sub pixels; and
        a fourth part extending in the second direction between the plurality of sub pixels.

10. The display apparatus according to claim 9, wherein the first pattern further includes a first diagonal part between the first part and the second part, the first diagonal part extending in a third direction different from the first direction and the second direction, and
    wherein the second pattern further includes a second diagonal part between the third part and the fourth part, the second diagonal part extending in the third direction.

11. The display apparatus according to claim 1, wherein the first pattern is a trench extending through the bank toward the first wiring line, and the second pattern is a reverse spacer disposed on the bank.

12. The display apparatus according to claim 11, further comprising:

a plurality of second patterns at least partially enclosing one sub pixel among the plurality of sub pixels, the plurality of second patterns spaced apart from each other.

13. The display apparatus according to claim 1, further comprising:
a dummy line that is electrically connected to the first wiring line, the dummy line overlapped by the first pattern and closer to the first pattern than the first wiring line.

14. The display apparatus according to claim 1, wherein the plurality of sub pixels includes a first sub pixel, a second sub pixel, and a third sub pixel which emit different colors of light, wherein the first sub pixel, the second sub pixel, and the third sub pixel have different turn-on voltages.

15. The display apparatus according to claim 14, wherein a number of first patterns disposed between the first sub pixel and the third sub pixel is different from a number of first patterns disposed between the second sub pixel and the third sub pixel.

16. The display apparatus according to claim 14, further comprising:
a second pattern disposed on the bank between the plurality of sub pixels,
wherein a number of second patterns disposed between the first sub pixel and the third sub pixel is different from a number of second patterns disposed between the second sub pixel and the third sub pixel.

17. A display apparatus comprising:
a substrate in which a plurality of sub pixels are defined;
a plurality of light emitting diodes which are disposed in the plurality of sub pixels, the plurality of light emitting diodes having an organic layer that includes an organic light emitting layer that is shared between the plurality of light emitting diodes and a cathode electrode shared between the plurality of light emitting diodes;
a bank disposed below the cathode electrode and between pairs of light emitting diodes from the plurality of light emitting diodes;
a first pattern through a thickness of the bank;
a second pattern disposed on the bank, the second pattern spaced apart from the first pattern; and
a plurality of wiring lines disposed between the bank and the substrate,
wherein the plurality of wiring lines includes a first wiring line that overlaps the first pattern and a second wiring line that overlaps at least a part of the second pattern,
wherein the first wiring line transmits a direct current (DC) signal and the second wiring line transmits an alternating current (AC) signal,
wherein a second portion of the cathode electrode that overlaps the first wiring line is closer to the first wiring line than a first portion of the cathode electrode that is non-overlapping with the first wiring line.

18. The display apparatus of claim 17,
wherein the second portion of the cathode electrode is disposed in the first pattern through the bank and the second portion of the cathode electrode is disposed outside of the first pattern.

19. The display apparatus of claim 18, further comprising:
another first pattern through the thickness of the bank, wherein the cathode electrode comprises a third portion that is disposed in the other first pattern and overlaps the first wiring line that is overlapped by the first portion of the cathode electrode.

20. The display apparatus of claim 18, wherein the first pattern is a trench that extends through the bank toward the wiring line.

21. The display apparatus of claim 17, wherein the DC signal is a power signal.

22. A display apparatus, comprising:
a substrate in which a plurality of sub pixels are defined;
a plurality of light emitting diodes which are disposed in the plurality of sub pixels, the plurality of light emitting diodes having an organic layer shared between the plurality of light emitting diodes and a cathode electrode shared between the plurality of light emitting diodes;
a bank disposed below the cathode electrode and between pairs of light emitting diodes from the plurality of light emitting diodes;
a plurality of wiring lines disposed between the bank and the substrate; and
a first pattern through a thickness of the bank, the first pattern overlapping a first wiring line from the plurality of wiring lines,
wherein a first portion of the cathode electrode is disposed outside of the first pattern and a second portion of the cathode electrode is disposed in the first pattern such that the second portion of the cathode electrode overlaps the first wiring line without a metal layer between the second portion of the cathode electrode and the first wiring line,
wherein the second portion of the cathode electrode is insulated from the first wiring line.

23. A display apparatus, comprising:
a substrate in which a plurality of sub pixels are defined;
a plurality of light emitting diodes which are disposed in the plurality of sub pixels, the plurality of light emitting diodes having an organic layer shared between the plurality of light emitting diodes and a cathode electrode shared between the plurality of light emitting diodes;
a bank disposed below the cathode electrode and between pairs of light emitting diodes from the plurality of light emitting diodes;
a plurality of wiring lines disposed between the bank and the substrate;
a first pattern through a thickness of the bank, the first pattern overlapping a first wiring line from the plurality of wiring lines, wherein a first portion of the cathode electrode is disposed outside of the first pattern and a second portion of the cathode electrode is disposed in the first pattern; and
at least one insulating layer disposed between the plurality of wiring lines and the second portion of the cathode electrode that is disposed in the first pattern,
wherein the second portion of the cathode electrode that is disposed in the first pattern overlaps the first wiring line and a capacitor is formed between the second portion of the cathode electrode and the first wiring line.

24. A display apparatus, comprising:
a substrate in which a plurality of sub pixels are defined;
a plurality of light emitting diodes which are disposed in the plurality of sub pixels, the plurality of light emitting diodes having an organic layer shared between the plurality of light emitting diodes and a cathode electrode shared between the plurality of light emitting diodes;

a bank disposed below the cathode electrode and between pairs of light emitting diodes from the plurality of light emitting diodes;
a plurality of wiring lines disposed between the bank and the substrate; and
a first pattern through a thickness of the bank, the first pattern overlapping a first wiring line from the plurality of wiring lines,
wherein a first portion of the cathode electrode is disposed outside of the first pattern and a second portion of the cathode electrode is disposed in the first pattern,
wherein the plurality of sub pixels includes a first sub pixel, a second sub pixel, and a third sub pixel which emit different colors of light, wherein the first sub pixel, the second sub pixel, and the third sub pixel have different turn-on voltages.

* * * * *